US012100465B2

(12) United States Patent
Hwang et al.

(10) Patent No.: US 12,100,465 B2
(45) Date of Patent: Sep. 24, 2024

(54) ERROR CORRECTION CIRCUIT USING MULTI-CLOCK AND SEMICONDUCTOR DEVICE INCLUDING THE SAME

(71) Applicant: Samsung Electronics Co., Ltd., Suwon-si (KR)

(72) Inventors: Youngjun Hwang, Hwaseong-si (KR); Hongrak Son, Anyang-si (KR); Geunyeong Yu, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 183 days.

(21) Appl. No.: 17/847,744

(22) Filed: Jun. 23, 2022

(65) Prior Publication Data

US 2023/0065578 A1 Mar. 2, 2023

(30) Foreign Application Priority Data

Sep. 1, 2021 (KR) .................. 10-2021-0116506

(51) Int. Cl.
| | |
|---|---|
| G11C 16/06 | (2006.01) |
| G11C 7/10 | (2006.01) |
| G11C 7/22 | (2006.01) |
| G11C 29/02 | (2006.01) |
| G11C 29/52 | (2006.01) |

(52) U.S. Cl.
CPC ............ *G11C 29/52* (2013.01); *G11C 7/1039* (2013.01); *G11C 7/222* (2013.01); *G11C 29/023* (2013.01)

(58) Field of Classification Search
CPC .................................................. G11C 29/52

USPC ..................................................... 365/185.09
See application file for complete search history.

(56) References Cited

U.S. PATENT DOCUMENTS

| | | | |
|---|---|---|---|
| 6,549,593 B1* | 4/2003 | Rumreich | ............... G06F 5/06 375/357 |
| 6,678,860 B1* | 1/2004 | Lee | ..................... H03M 13/13 714/763 |
| 8,671,323 B2 | 3/2014 | Sham et al. | |
| 8,726,122 B2 | 5/2014 | Pisek | |
| 8,839,051 B1 | 9/2014 | Yeung et al. | |

(Continued)

FOREIGN PATENT DOCUMENTS

KR    10-2009-0079007 A    7/2009

*Primary Examiner* — Hoai V Ho
(74) *Attorney, Agent, or Firm* — Harness, Dickey & Pierce, P.L.C.

(57) ABSTRACT

Various example embodiments of the inventive concepts provide an error correction circuit and a semiconductor device. The error correction circuit includes clock-sync distributor circuitry configured to output a plurality of distributor output data based on distributor reception data received using a first clock signal, each of the plurality of distributor output data output based on the first clock signal or a second clock signal, the second clock signal having a higher frequency than a frequency of the first clock signal, a node processor configured to generate a plurality of output data by performing error correction decoding using the plurality of distributor output data, output a first subset of the plurality of output data based on the first clock signal, and output a second subset of the plurality of output data based on the second clock signal, and clock-sync combiner circuitry configured to output, based on the first clock signal, the plurality of output data received from the node processor.

20 Claims, 14 Drawing Sheets

(56) References Cited

U.S. PATENT DOCUMENTS

| | | |
|---|---|---|
| 8,918,694 B2 | 12/2014 | Morero et al. |
| 9,276,610 B2 | 3/2016 | Xia et al. |
| 10,193,569 B2 | 1/2019 | Tseng et al. |
| 2004/0031857 A1* | 2/2004 | Sato .................. G06Q 20/341 235/492 |
| 2007/0237007 A1* | 10/2007 | Muraoka ............ G06F 11/1068 365/189.05 |
| 2008/0118229 A1 | 5/2008 | Bliss |
| 2009/0010370 A1* | 1/2009 | Hamaminato ...... H04L 27/2657 375/359 |

\* cited by examiner

FIG. 11

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

ERROR CORRECTION CIRCUIT USING MULTI-CLOCK AND SEMICONDUCTOR DEVICE INCLUDING THE SAME

CROSS-REFERENCE TO RELATED APPLICATION

This U.S. non-provisional application is based on and claims the benefit of priority under 35 U.S.C. § 119 to Korean Patent Application No. 10-2021-0116506, filed on Sep. 1, 2021, in the Korean Intellectual Property Office, the disclosure of which is incorporated by reference herein in its entirety.

BACKGROUND

Various example embodiments of the inventive concepts relate to a semiconductor device, a system including the semiconductor device, and/or a method of operating a semiconductor device, and more particularly, to a semiconductor device including an error correction circuit using a multi-clock, a system including the same, and/or a method of operating the same.

The degree of integration of semiconductor devices has recently increased, and in order to reduce and/or prevent an abnormal operation of memory cells and to increase the reliability of the semiconductor devices, error correction circuits (ECCs) are included in the semiconductor devices. However, when operating speeds of the ECCs are lower than the operating speeds of controllers, a problem occurs in that the highest operating speeds (throughputs) of the controllers are limited by the ECCs. Accordingly, ECCs that increase the degree of integration of semiconductor devices and do not interfere with high-speed operations of the semiconductor devices are desired and/or required.

SUMMARY

Various example embodiments of the inventive concepts provide semiconductor devices that reduce power consumption while performing a high-speed operation.

Technical problems associated with semiconductor devices including ECCs are not limited to the technical problems described above, and other technical problems not described above will be clearly understood by those of ordinary skill in the art from the following description.

According to at least one example embodiment of the inventive concepts, there is provided an error correction circuit including clock-sync distributor circuitry configured to output a plurality of distributor output data based on distributor reception data received using a first clock signal, each of the plurality of distributor output data output based on the first clock signal or a second clock signal, the second clock signal having a higher frequency than a frequency of the first clock signal, a node processor configured to generate a plurality of output data by performing error correction decoding using the plurality of distributor output data, output a first subset of the plurality of output data based on the first clock signal, and output a second subset of the plurality of output data based on the second clock signal, and clock-sync combiner circuitry configured to output, based on the first clock signal, the plurality of output data received from the node processor.

According to at least one example embodiment of the inventive concepts, there is provided an error correction circuit including clock-sync distributor circuitry configured to receive distributor reception data based on a first clock signal, and output a plurality of first distributor output data based on a second clock signal having a higher frequency than a frequency of the first clock signal, and output a plurality of second distributor output data based on a third clock signal having a higher frequency than the frequency of the second clock signal, a node processor configured to generate a plurality of output data by performing error correction decoding using the plurality of first distributor output data and the plurality of second distributor output data, output a first subset of the plurality of output data based on the second clock signal, and output a second subset of the plurality of output data based on the third clock signal, and clock-sync combiner circuitry configured to output, based on the first clock signal, the plurality of output data.

According to at least one example embodiment of the inventive concepts, there is provided a semiconductor device including a controller including an error correction circuit, the error correction circuitry configured to perform error correction decoding of read data based on a plurality of clock signals having different frequencies, and a memory device configured to output the read data and provide the read data to the controller.

BRIEF DESCRIPTION OF THE DRAWINGS

Various example embodiments of the inventive concepts will be more clearly understood from the following detailed description taken in conjunction with the accompanying drawings in which:

FIG. 11 is a diagram illustrating an operation of a node processor according to at least one example embodiment;

DETAILED DESCRIPTION

Figure 1:
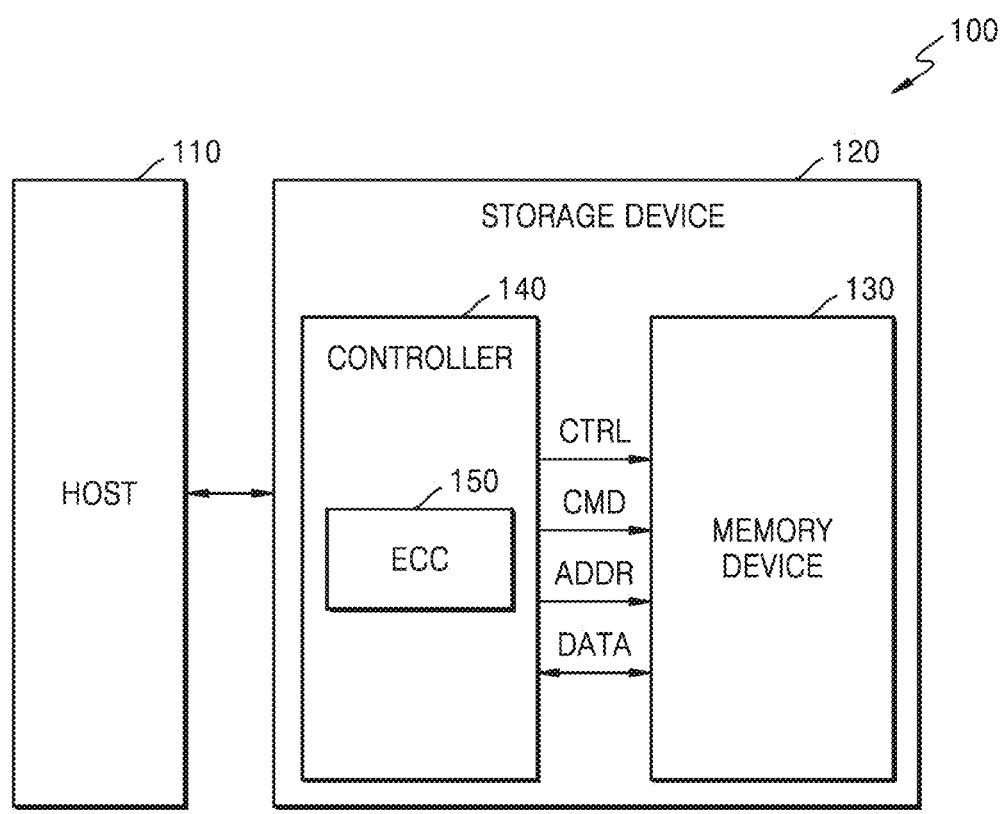
FIG. 1 is a block diagram of a memory system according to at least one example embodiment.

Hereinafter, various example embodiments of the inventive concepts will be described in detail with reference to the accompanying drawings. When description is made with reference to the drawings, the same or corresponding components are given the same reference numerals, and redundant descriptions thereof are omitted.

FIG. 1 is a block diagram conceptually illustrating a memory system according to at least one example embodiment of the inventive concepts.

Referring to FIG. 1, a memory system 100 may include a host 110 (e.g., a host device, etc.) and/or a storage device 120, etc., but the example embodiments are not limited thereto, and for example, the memory system 100 may include a greater or lesser number of constituent components, etc.

The memory system 100 may include a data center having many host machines and/or servers that operate hundreds of virtual machines, etc. For example, the memory system 100 may include a computing device, such as a laptop computer, a desktop computer, a server computer, a workstation, a portable communication terminal, a personal digital assistant (PDA), a portable multi-media player (PMP), a smartphone, and/or a tablet smart device, a virtual machine, and/or a virtual computing device thereof, but is not limited thereto. Additionally, the memory system 100 may include some of components included in a computing system, such as a graphics card, etc. However, the memory system 100 is not limited to the hardware configuration described below and may have other configurations.

The host 110 (e.g., host device, external device, etc.) may refer to a data processing device capable of processing data. The host 110 may execute an operating system (OS) and/or various applications. The host 110 may include a central processing unit (CPU), a graphics processing unit (GPU), a neural processing unit (NPU), a digital signal processor (DSP), a microprocessor, and/or an application processor (AP), etc., but the example embodiments are not limited thereto. In at least one example embodiment, the memory system 100 may be included in a mobile device and the host 110 may be implemented by an AP, etc. In at least one example embodiment, the host 110 may be implemented by a system-on-a-chip (SoC), and thus, the host 110 may be embedded in the system 100, etc. The host 110 may include one or more processors, but is not limited thereto. The host 110 may include a multi-core processor, but is not limited thereto.

The host 110 may execute one or more machine-executable instructions (e.g., computer executable instructions, computer readable instructions, etc.), one or more types of software, one or more types of firmware, or a combination thereof. The host 110 may control a data processing operation for the storage device 120, but the example embodiments are not limited thereto.

The host 110 may communicate with the storage device 120 by using various protocols. For example, the host 110 may communicate with the storage device 120 by using an interface protocol, such as peripheral component interconnect-express (PCI-E), advanced technology attachment (ATA), serial ATA (SATA), parallel ATA (PATA), and/or serial attached small computer small interface (SCSI) (SAS), etc. In addition, various other interface protocols, such as universal flash storage (UFS), Universal Serial Bus (USB), multi-media card (MMC), enhanced small disk interface (ESDI), and/or integrated drive electronics (IDE), etc., may be applied to a protocol between the host 110 and the storage devices 120, but the example embodiments are not limited thereto.

The storage device 120 may include at least one memory device 130 and/or at least one controller 140, etc., but the example embodiments are not limited thereto. The storage device 120 may include an internal memory embedded in an electronic device, but is not limited thereto. For example, the storage device 120 may include a solid state drive or solid state disk (SSD), a UFS, a memory card, a micro secure digital (SD) card, and/or an embedded multi-media card (eMMC), etc. The storage device 120 may also include an external memory device detachable from an electronic device. For example, the storage device 120 may include a UFS memory card, compact flash (CF), a secure digital (SD) card, a micro secure digital (micro-SD) card, a mini secure digital (mini-SD) card, an extreme digital (xD) card, and/or a memory stick, etc., but is not limited thereto.

The memory device 130 perform memory operations under the control by the controller 140, such as storing (e.g., writing) data, reading data, and/or erasing data, etc. FIG. 1 illustrates that the storage device 120 includes one memory device 130 but the example embodiments are not limited thereto, and the storage device 120 may include a plurality of memory devices, etc.

The memory device 130 may include various types of memories. For example, the memory device 130 may also include a non-volatile memory device, such as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), and/or ferroelectric random access memory (FRAM), etc., the memory device 130 may include a volatile memory device, such as dynamic random access memory (DRAM), static random access memory (SRAM), mobile DRAM, double data rate synchronous dynamic random access memory (DDR SDRAM), low power DDR (LPDDR) SDRAM, Graphic DDR (GDDR) SDRAM, and/or Rambus dynamic random access memory (RDRAM), etc., but the example embodiments are not limited thereto. In the following drawings, a case in which the memory device 130 is a NAND flash memory device is described, but the example embodiments of the inventive concepts are not limited thereto. Although not illustrated, the memory device 130 may include a memory cell array, a write/read circuit, and/or a control logic (e.g., control logic circuitry, a memory controller, etc.), etc. When the memory device 130 is a resistive memory device, the memory cell array may include resistive memory cells, etc.

The controller 140 may control all operations of the storage device 120. The controller 140 may execute firmware when power is supplied to the storage device 120. The controller 140 may control the memory device 130 to read data stored in the memory device 130 and/or write data, etc., to the memory device 130 according to and/or based on a request from the host 110. Specifically, the controller 140 may provide an address ADDR, a command CMD, and/or a control signal CTRL to the memory device 130 to control a write (and/or program) operation, a read operation, and/or an erase operation, etc., of the memory device 130. In addition, the controller 140 may transmit data to be written to and/or receive data read from the memory device 130, etc.

In addition, the controller 140 may control the memory device 130 to perform an internal management operation and/or a background operation of the storage device 120 irrespective of a request of the host 110. The controller 140 may be embodied on a system on chip (SoC), an application specific integrated circuit (ASIC), a field programmable gate array (FPGA), etc., but is not limited thereto.

The controller 140 may include an error correction circuit 150. The error correction circuit 150 may provide accurate data by detecting and correcting errors in data input from the host 110 and/or data output from the memory device 130. The error correction circuit 150 may be included in a circuit, a system, and/or a device, etc., for correcting errors.

The error correction circuit 150 may perform data error detection and a correction operation by using any one of a Hamming Code, a Reed-Solomon (RS) code, a Bose-Chaudhuri-Hochquenghem (BCH) code, and/or a low-density parity-check code (LDPC), etc. Hereinafter, the error correction circuit 150 may be described as performing error detection and a correction operation of data by using an LDPC code but is not limited thereto. Hereinafter, the controller 140 and the error correction circuit 150 are described in detail.

Figure 2:
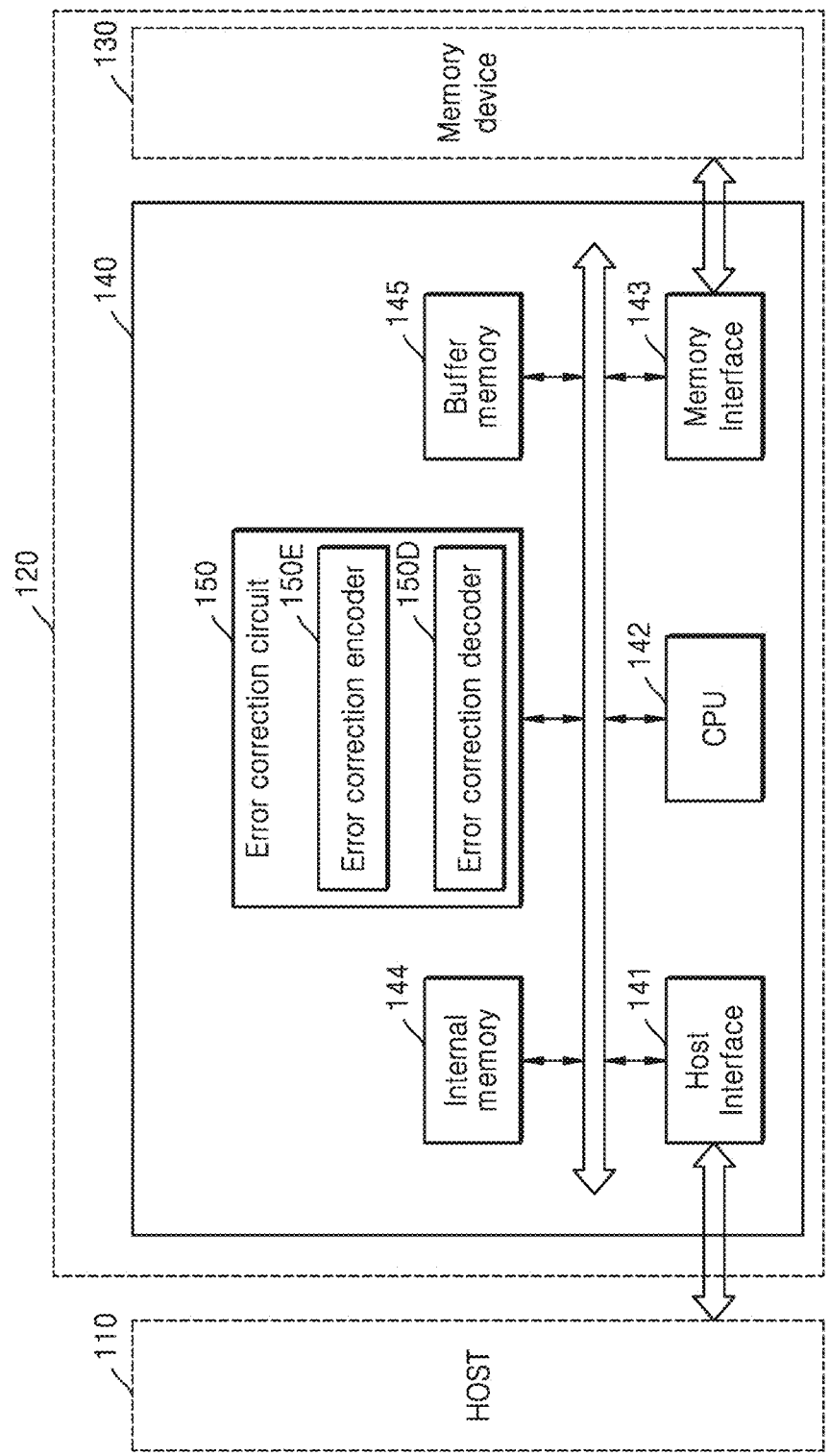
FIG. 2 is a block diagram illustrating a controller according to at least one example embodiment.

FIG. 2 is a block diagram illustrating a controller according to at least one example embodiment. In detail, FIG. 2 is an example block diagram illustrating the controller 140 of FIG. 1, but the example embodiments are not limited thereto.

Referring to FIGS. 1 and 2, the controller 140 may include a host interface 141, a CPU 142, a memory interface 143, an internal memory 144, a buffer memory 145, and/or an error correction circuit 150, etc. However, the example embodiments of the inventive concepts are not limited thereto, and the controller 140 may further include components not illustrated in FIG. 2.

The host interface 141 may transmit a request from the host 110 to the CPU 142. The host interface 141 may receive a command and/or a clock signal from the host 110 under the control by the CPU 142 and provide a physical connection between the host 110 and the memory device 130. For example, the host interface 141 may receive original data corresponding to a program request of the host 110 from the host 110 and store the original data in the buffer memory 145, but the example embodiments are not limited thereto. The host interface 141 may transmit a decoded codeword stored in the buffer memory 145 to the host 110, etc.

The host interface 141 may communicate with the host 110 by using various interface protocols. For example, the host interface 141 may communicate with the host 110 by using at least one interface protocol among non-volatile memory express (NVMe), PCI-E, ATA, SATA, PATA, USB, MMC, ESDI, IDE, mobile industry processor interface (MIPI), UFS, small computer small interface (SCSI), and/or SAS, etc., but is not limited thereto.

The CPU 142 may control the host interface 141, the memory interface 143, the internal memory 144, the buffer memory 145, and/or the error correction circuit 150, etc., but is not limited thereto. The CPU 142 may perform various arithmetic operations and/or generate commands and/or addresses for the memory device 130. For example, the CPU 142 may generate various commands and/or addresses desired and/or required for a program operation (e.g., a write operation), a read operation, an erase operation, and so on, according to a request from the host interface 141, but the example embodiments are not limited thereto.

When receiving a program request (e.g., write request) from the host interface 141, the CPU 142 may control the error correction circuit 150 such that the error correction circuit 150 performs error correction encoding on original data stored in the buffer memory 145. When the CPU 142 receives notification from the error correction circuit 150 that a codeword (e.g., a ECC codeword, etc.) is generated, the CPU 142 may generate program commands (e.g., write commands) and/or addresses, etc. In addition, the CPU 142 may control the memory interface 143 to transmit the generated program commands and/or addresses to the memory device 130 together with codewords stored in the buffer memory 145, etc., but the example embodiments are not limited thereto.

When receiving a read request from the host interface 141, the CPU 142 may generate read commands and/or addresses, but is not limited thereto. In addition, the CPU 142 may control the memory interface 143 to transmit the generated read commands and/or addresses, etc., to the memory device 130. When the CPU 142 receives notification from the memory interface 143 that read data corresponding to the read commands has been received, the CPU 142 may control the error correction circuit 150 such that the error correction circuit 150 performs error correction decoding of the read data stored in the buffer memory 145. When the CPU 142 receives notification from the error correction circuit 150 that the decoded codewords (e.g., the results of the error correction operation, etc.) have been generated, the CPU 142 may control the host interface 141 such that the decoded codewords stored in the buffer memory 145 are transmitted to the host 110, but the example embodiments are not limited thereto.

The memory interface 143 may perform communication between the controller 140 and the memory device 130 by using various interface protocols. For example, the memory interface 143 may transmit a program command and/or an address received from the CPU 142, and a codeword stored in the buffer memory 145 to the memory device 130 during a program operation, but the example embodiments are not limited thereto.

For example, the memory interface 143 may transmit a read command and/or an address received from the CPU 142 to the memory device 130 during a read operation. In addition, the memory interface 143 may store read data received from the memory device 130 in the buffer memory 145 and may notify the CPU 142 that the read data is received, but the example embodiments are not limited thereto.

The internal memory 144 may store various information desired and/or required for an operation of the controller 140. For example, the internal memory 144 may store many tables, etc., but is not limited thereto. For example, the internal memory 144 may store an address mapping table in which logical addresses and physical addresses are mapped, etc., but is not limited thereto.

The buffer memory 145 may temporarily store data while the controller 140 controls the memory device 130, but is not limited thereto. For example, during a program operation, the buffer memory 145 may store original data received from the host interface 141 and/or transmit the stored original data to the error correction circuit 150, etc. In addition, the buffer memory 145 may store codewords received from the error correction circuit 150 and transmit the stored codewords to the memory interface 143, etc.

For example, during a read operation, the buffer memory 145 may store read data received from the memory device 130 and/or transmit the stored read data to the error correction circuit 150, etc. In addition, the buffer memory 145 may store decoded codewords received from the error correction circuit 150 and/or transmit the stored decoded codewords to the host interface 141, etc.

The buffer memory 145 is illustrated to be provided inside the controller 140 in FIG. 2 but is not limited thereto, and the buffer memory 145 may be provided outside (e.g., external to) the controller 140, etc., but the example embodiments are not limited thereto.

The error correction circuit 150 may perform error correction encoding on original data and/or perform error correction decoding of read data. The error correction circuit 150 may have a desired and/or certain level of error correction capability. For example, the error correction circuit 150 may detect and correct errors included in the read data when the number of error bits in the read data does not exceed the error correction capability. The largest number of error bits that does not exceed error correction capability of the error correction circuit 150 may be referred to as a "the largest number of allowable error bits".

The error correction circuit 150 may include an error correction encoder 150E and/or an error correction decoder 150D, etc., but the example embodiments are not limited thereto. The error correction encoder 150E and/or the error correction decoder 150D may perform an error correction operation by using the same parity check matrix, but is not limited thereto.

The error correction encoder 150E may generate a codeword (e.g., ECC codeword, etc.) by performing error correction encoding on original data received from the buffer memory 145. The error correction encoder 150E may transmit the generated codeword to the buffer memory 145 and notify the CPU 142 that the codeword is generated, but is not limited thereto.

The error correction decoder 150D may generate a decoded codeword by performing error correction decoding of read data received from the buffer memory 145, etc. The error correction decoder 150D may transmit the decoded codeword to the buffer memory 145 and notify the CPU 142 that the decoded codeword is generated, but is not limited thereto. When an error included in the read data may not be corrected, the error correction decoder 150D may notify the CPU 142 that the error correction decoding failed, etc.

The error correction decoder 150D may perform error correction decoding by using a message passing algorithm (MPA), which is also referred to as a belief propagation algorithm (BPA), but the example embodiments are not limited thereto. For example, the error correction decoder 150D may perform error correction decoding by using a sum-product algorithm or a min-sum algorithm, but is not limited thereto.

The error correction decoder 150D may perform error correction decoding by performing at least one iteration within a desired and/or preset largest iteration number I. When a valid codeword satisfying the constraints and/or parameters of a parity check matrix of an error correction code is generated within the largest iteration number I, the error correction decoder 150D may output the generated valid codeword as a decoded codeword, etc. When the valid codeword satisfying the constraints and/or parameters of the parity check matrix of the error correction code is not generated within the largest iteration number I, the error correction decoder 150D may output a fail signal indicating that the error correction decoding failed, etc.

In addition, although not illustrated in the drawing, the error correction circuit 150 may further include a post processor which supports the error correction decoder 150D to generate a valid codeword, but the example embodiments are not limited thereto. The post processor may correct various parameters used for error correction decoding and/or support the error correction decoder 150D, such that error correction decoding may be performed by using the corrected parameters, etc.

The error correction decoder 150D according to at least one example embodiment of the inventive concepts operates by using a multi-clock, and thus, power consumption is reduced and/or high-speed operation is performed. Hereinafter, the error correction decoder 150D is described in more detail.

Figure 3:
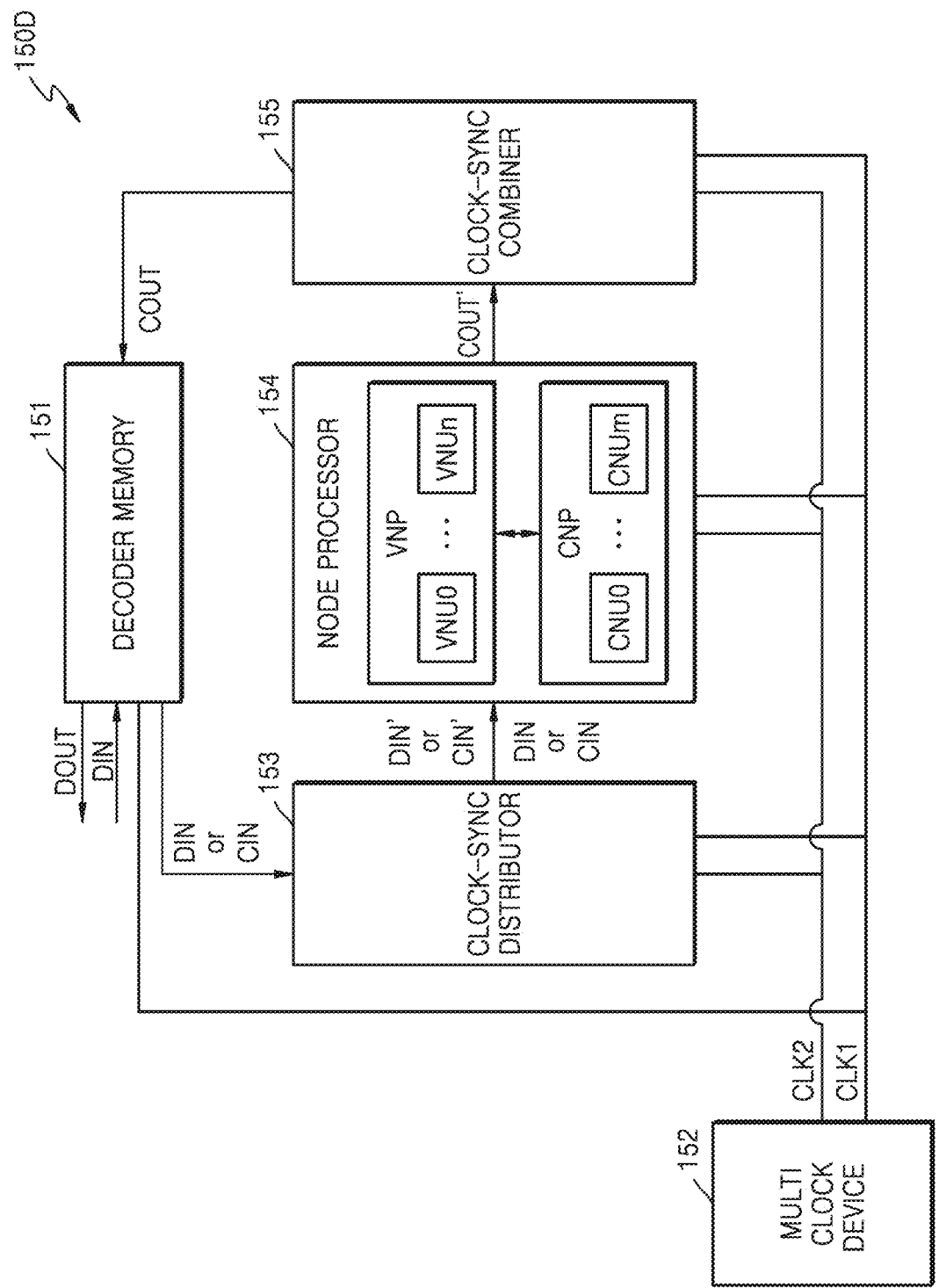
FIG. 3 is a block diagram illustrating an error correction decoder according to at least one example embodiment.

FIG. 3 is a block diagram illustrating the error correction decoder 150D according to at least one example embodiment. In detail, FIG. 3 is a diagram illustrating the error correction decoder 150D included in the error correction circuit 150 of FIG. 2, but the example embodiments are not limited thereto. Hereinafter, the error correction decoder 150D is described with reference to FIG. 2.

Referring to FIG. 3, the error correction decoder 150D includes a decoder memory 151, a multi-clock device 152, a clock-sync distributor 153 (e.g., clock-sync distributor circuitry), a node processor 154, and/or a clock-sync combiner 155 (e.g., clock-sync combiner circuitry), etc., but the example embodiments are not limited thereto, and for example, the error correction decoder 150D may include a greater or lesser number of constituent components. According to some example embodiments, the decoder memory 151, multi-clock device 152, clock-sync distributor 153, node processor 154, and/or a clock-sync combiner 155, etc., may be implemented as processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The decoder memory 151 may temporarily store data while the error correction decoder 150D operates. For example, the decoder memory 151 may store read data DIN input to the error correction decoder 150D and/or a decoded codeword DOUT output from the error correction decoder 150D, etc., but is not limited thereto. The decoded codeword DOUT may indicate a valid codeword satisfying constraints and/or parameters of a parity check matrix of an error correction code within the largest iteration number I, but the example embodiments are not limited thereto.

The decoder memory 151 may store a codeword COUT output from the clock-sync combiner 155 (e.g., the clock-sync combiner circuitry, etc.). The decoder memory 151 may store a plurality of codewords generated by repeatedly performing error correction decoding, etc.

The decoder memory 151 may store sub-data generated when the error correction decoder 150D performs an error correction operation. The sub-data may indicate internal information (e.g., metadata, etc.) generated when error correction decoding is repeatedly performed by the clock-sync distributor 153 (e.g., the clock-sync distributor circuitry, etc.), the node processor 154, and/or the clock-sync combiner 155, etc., but is not limited thereto. For example, the sub-data may include a V2C message (e.g., a variable node to check node message), a C2V message (e.g., a check node to variable node message), a syndrome, and/or a checksum, etc.

The decoder memory 151 may include DRAM, such as DDR SDRAM, DDR4 SDRAM, low power double data rate 4 (LPDDR4) SDRAM, graphics double data rate (GDDR) SDRAM, LPDDR, RDRAM, and/or SRAM, etc., but the example embodiments of the inventive concepts are not limited thereto. The decoder memory 151 may include at least one buffer to transmit data to the clock-sync distributor 153 and/or to receive data from the clock-sync combiner 155, etc.

The multi-clock device 152 (e.g., multi-clock generator, multi-clock generating device, etc.) may provide and/or generate clock signals used in the error correction decoder 150D, but the example embodiments are not limited thereto. The multi-clock device 152 may provide a plurality of clock signals, etc., CLK1 and CLK2, etc., used in the error correction decoder 150D, but is not limited thereto. The multi-clock device 152 may generate, e.g., a first clock signal CLK1 and a second clock signal CLK2 having a higher frequency than a frequency of the first clock signal CLK1, but is not limited thereto. The multi-clock device 152 may control the frequencies of the first and/or second clock signals CLK1 and CLK2, etc. The multi-clock device 152 is illustrated as providing two clock signals of the first and second clock signals CLK1 and CLK2 in FIG. 3 but is not limited thereto, and the multi-clock device 152 may also provide three or more clock signals.

The multi-clock device 152 may provide the first clock signal CLK1 to the decoder memory 151, the clock-sync distributor 153, the node processor 154, and/or the clock-sync combiner 155, etc. The multi-clock device 152 may provide the second clock signal CLK2 to the clock-sync distributor 153, the node processor 154, and/or the clock-sync combiner 155, etc. Accordingly, the decoder memory 151 may operate based on the first clock signal CLK1, and the clock-sync distributor 153, the node processor 154, and/or the clock-sync combiner, etc., 155 may operate based on the first and second clock signals CLK1 and CLK2, but the example embodiments are not limited thereto.

The multi-clock device 152 may include an oscillator, a phase-locked loop (PLL) circuit, a delay-locked loop (DLL), and so on, but is not limited thereto. For example, the multi-clock device 152 may include a PLL circuit that generates a plurality of first and second clock signals CLK1 and CLK2, based on a clock signal received from the outside of the error correction decoder 150D. However, the example embodiments of the inventive concepts are not limited thereto, and the multi-clock device 152 may directly generate the plurality of first and second clock signals CLK1 and CLK2, etc. In addition, the multi-clock device 152 may receive at least one clock signal from the outside (e.g., an external source) of the error correction decoder 150D, and may divide the received at least one clock signal into various clock signals. Accordingly, the multi-clock device 152 may generate a new clock signal and/or a plurality of new clock signals from the received external clock signal, etc. For example, the multi-clock device 152 may generate the first and second clock signals CLK1 and CLK2 described above, but is not limited thereto.

The clock-sync distributor 153 may receive the plurality of clock signals, e.g., the first and second clock signals CLK1 and CLK2, from the multi-clock device 152, etc. The clock-sync distributor 153 may receive the read data DIN and/or a codeword CIN from the decoder memory 151, but is not limited thereto. The read data DIN and/or the codeword CIN received from the decoder memory 151 may be referred to as "distributor reception data DIN and/or CIN". The clock-sync distributor 153 may output the distributor reception data DIN and/or CIN based on a clock signal having a different frequency than a clock signal used to receive the distributor reception data DIN and/or CIN, etc. Read data DIN' and/or a codeword CIN' output from the clock-sync distributor 153 based on a clock signal having a different frequency from the clock signal used to receive the distributor reception data DIN and/or CIN may be referred to as distributor output data DIN' and/or CIN'. A frequency of the clock signal based on the distributor output data DIN' and/or CIN' may be higher than a frequency of the clock signal based on the distributor reception data DIN and/or CIN. For example, the distributor reception data DIN and/or CIN may be based on the first clock signal CLK1, and the distributor output data DIN' and/or CIN' may be based on the second clock signal CLK2.

The clock-sync distributor 153 may provide in parallel the distributor reception data DIN and/or CIN and/or the distributor output data DIN' and/or CIN' to the node processor 154. For example, the clock-sync distributor 153 may provide in parallel the distributor reception data DIN and/or CIN based on the first clock signal CLK1 and the distributor output data DIN' and/or CIN' based on the second clock signal CLK2, to the node processor 154, but the example embodiments are not limited thereto.

For example, the clock-sync distributor 153 may provide the distributor output data DIN' and/or CIN' to at least two variable node processing units among a plurality of variable node processing units VNU0 to VNUn included in the variable node processor VNP and may provide the distributor reception data DIN and/or CIN to the rest of the variable node processing units, but the example embodiments are not limited thereto. Additionally, the clock-sync distributor 153 may provide distributor output data DIN' and/or CIN' to the variable node processor VNP and provide the distributor reception data DIN and/or CIN to the check node processor CNP, but the example embodiments are not limited thereto.

For example, the clock-sync distributor 153 may receive the read data DIN based on the first clock signal CLK1 from the decoder memory 151 in a first iteration, and then output the read data DIN' based on the second clock signal CLK2, but is not limited thereto. That is, the clock-sync distributor 153 may generate the read data DIN' based on the second clock signal CLK2, and may provide in parallel the read data DIN based on the first clock signal CLK1 and the read data DIN' based on the second clock signal, to the node processor 154, but is not limited thereto.

For example, the clock-sync distributor 153 may receive the codeword CIN based on the first clock signal CLK1 from the decoder memory 151 in an iteration after the first iteration, and output the codeword CIN' based on the second clock signal CLK2, etc. That is, the clock-sync distributor 153 may generate the codeword CIN' based on the second clock signal CLK2, and provide in parallel the codeword CIN based on the first clock signal CLK1 and the codeword CIN' based on the second clock signal, to the node processor 154, but is not limited thereto.

The node processor 154 may receive in parallel the distributor reception data DIN and/or CIN and the distributor output data DIN' and/or CIN' from the clock-sync distributor 153. The node processor 154 may perform error correction decoding based on the distributor reception data DIN and/or CIN and the distributor output data DIN' and/or CIN', but is not limited thereto. The node processor 154 may provide output data COUT' generated as a result of error correction decoding to the clock-sync combiner 155, etc. Each of the output data COUT' (e.g., the generated codeword, the generated ECC codeword, etc.) may be based on the first clock signal CLK1 or the second clock signal CLK2, but the example embodiments are not limited thereto.

The node processor 154 may include a variable node processor VNP and/or a check node processor CNP, etc., but is not limited thereto. The variable node processor VNP and the check node processor CNP may operate in parallel, but the example embodiments are not limited thereto.

The variable node processor VNP may generate variable to check (V2C) messages based on data received in parallel from the clock-sync distributor 153 in the first iteration and/or transmit the generated V2C messages to the check node processor CNP, etc.

The check node processor CNP may update values of check nodes by using the V2C messages received from the variable node processor VNP, but is not limited thereto. The check node processor CNP may generate check to variable (C2V) messages and/or transmit the generated C2V messages to the variable node processor VNP, but is not limited thereto. The variable node processor VNP may generate the V2C messages based on the C2V messages received from the check node processor CNP in the first iteration and subsequent iterations and transmit the generated V2C messages to the check node processor CNP.

The variable node processor VNP may include a plurality of variable node processing units VNU0 to VNUn. The check node processor CNP may include a plurality of check node processing units CNU0 to CNUm. The variable node processing units VNU0 to VNUn and the check node processing units CNU0 to CNUm may be implemented by storage devices, such as registers, flip-flops, etc. The number of variable node processing units VNU0 to VNUn may be equal to or different from the number of check node processing units CNU0 to CNUm.

The variable node processor VNP may be connected to the check node processor CNP. The variable node processing units VNU0 to VNUn may be connected to the check node processing units CNU0 to CNUm. For example, the variable node processing units VNU0 to VNUn may respectively correspond to the check node processing units CNU0 to CNUm. Additionally, some (e.g., a subset) of the variable node processing units VNU0 to VNUn may be connected to the check node processing units CNU0 to CNUm. Additionally, some (e.g., a subset) of the variable node processing units VNU0 to VNUn may be simultaneously connected to some (e.g., a subset) of the check node processing units CNU0 to CNUm. The variable node processing units VNU0 to VNUn may be connected in various ways to the check node processing units CNU0 to CNUm depending on, e.g., an LDPC algorithm defining the error correction decoder 150D, a structure of a parity check matrix, column-by-column or row-by-row decoding of the parity check matrix, and so on, but the connection is not limited thereto.

The variable node processing units VNU0 to VNUn may respectively calculate V2C messages by using the C2V messages received from the check node processing units CNU0 to CNUm. Each of the variable node processing units VNU0 to VNUn may store variable node information desired and/or required for calculating the V2C message of the corresponding variable node.

Each of the variable node processing units VNU0 to VNUn may operate based on a clock signal. For example, each of the variable node processing units VNU0 to VNUn may operate based on the first clock signal CLK1 or the second clock signal CLK2 provided from the multi-clock device 152, but are not limited thereto. According to at least one example embodiment, the same clock signal (for example, the first clock signal CLK1) may be provided to all of the variable node processing units VNU0 to VNUn, or the first clock signal CLK1 may be provided to some (e.g., a first subset) of the variable node processing units VNU0 to VNUn, and the second clock signal CLK2 may be provided to the other variable node processing units (e.g., a second subset) thereof, but the example embodiments are not limited thereto.

Each of the variable node processing units VNU0 to VNUn may store variable node information corresponding to different variable nodes based on at least one clock signal received from the multi-clock device 152, etc. Each of the variable node processing units VNU0 to VNUn may calculate the V2C message and/or the C2V message by using the stored variable node information, etc. That is, each of the variable node processing units VNU0 to VNUn may calculate the V2C message based on the first clock signal CLK1 or the second clock signal CLK2 provided from the multi-clock device 152, but the example embodiments are not limited thereto. The calculated V2C message may be transmitted to the check node processing units CNU0 to CNUm connected respectively to the variable node processing units VNU0 to VNUn, etc.

The check node processing units CNU0 to CNUm may calculate the C2V message from the V2C message received from the variable node processing units VNU0 to VNUn, respectively. Each of the check node processing units CNU0 to CNUm may store information desired and/or required for calculating the C2V message of a corresponding check node, etc.

Each of the check node processing units CNU0 to CNUm may operate based on a clock signal. For example, each of the check node processing units CNU0 to CNUm may operate based on the first clock signal CLK1 or the second clock signal CLK2 provided from the multi-clock device 152, but are not limited thereto. According to at least one example embodiment, the same clock signal (for example, the second clock signal CLK2) may also be provided to all of the check node processing units CNU0 to CNUm, or the first clock signal CLK1 may be provided to some (e.g., a first subset) of the check node processing units CNU0 to CNUm, and the second clock signal CLK2 may be provided to the others check node processing units thereof (e.g., a second subset), but the example embodiments are not limited thereto.

The check node processing units CNU0 to CNUm and the variable node processing units VNU0 to VNUn may operate based on the same clock signal or different clock signals. For example, all of the check node processing units CNU0 to CNUm may operate based on the second clock signal CLK2, and all of the variable node processing units VNU0 to VNUn may operate based on the first clock signal CLK1, etc. Additionally, some of the check node processing units CNU0 to CNUm and some of the variable node processing units VNU0 to VNUn may operate based on the first clock signal CLK1, and the others thereof may operate based on the second clock signal CLK2, but the example embodiments are not limited thereto.

Each of the check node processing units CNU0 to CNUm may store check node information corresponding to different check nodes based on a clock signal received from the multi-clock device 152, etc. Each of the check node processing units CNU0 to CNUm may calculate the V2C message and the C2V message by using the stored check node information. That is, each of the check node processing units CNU0 to CNUm may calculate the C2V message, based on the first clock signal CLK1 or the second clock signal CLK2 provided from the multi-clock device 152, and transmit the calculated C2V message to at least one of the variable node processing units VNU0 to VNUn, but the example embodiments are not limited thereto.

The clock-sync combiner 155 may receive, for example, the first and second clock signals CLK1 and CLK2 from the multi-clock device 152, but is not limited thereto. The clock-sync combiner 155 may receive the output data COUT' of the node processor 154, but is not limited thereto. Each of the output data COUT' may be received by the clock-sync combiner 155 based on the first clock signal CLK1 or the second clock signal CLK2, etc.

The clock-sync combiner 155 may receive data based on the second clock signal CLK2 among the output data COUT' of the node processor 154, and/or output data based on the first clock signal CLK1, but the example embodiments are not limited thereto. The clock-sync combiner 155 may receive data based on the first clock signal CLK1 among the output data COUT' of the node processor 154, and/or output the data as it is (e.g., output the data based on the first clock signal CLK1), but is not limited thereto. The output data of the clock-sync combiner 155 may be referred to as a "codeword". The clock-sync combiner 155 may transmit the codeword COUT, based on the first clock signal CLK1, to the decoder memory 151. That is, all data output from the clock-sync combiner 155 may be based on the first clock signal CLK1, but the example embodiments are not limited thereto.

At least one of codewords output from the clock-sync combiner 155 may be a valid codeword satisfying constraints and/or parameters of a parity check matrix of an error correction code within the largest iteration number I. However, the example embodiments of the inventive concepts are not limited thereto, and there may be a case in which there is no valid codeword satisfying constraints and/or parameters of a parity check matrix of an error correction code within the largest iteration number I among the codewords output from the clock-sync combiner 155, etc.

Hereinafter, an operation of the error correction decoder 150D is described with reference to at least one example embodiment of the node processor 154.

Figure 4:
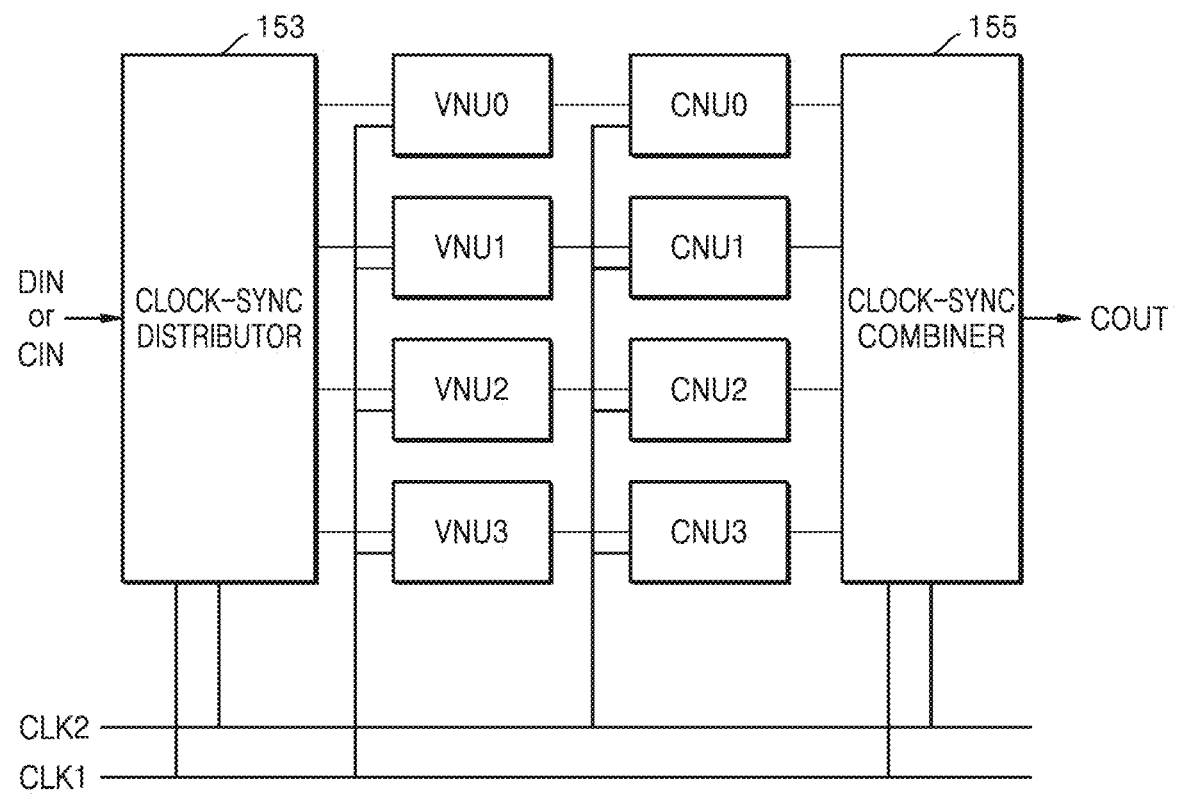
FIG. 4 is a diagram illustrating an operation of an error correction decoder according to at least one example embodiment.

FIG. 4 is a diagram illustrating an operation of an error correction decoder according to at least one example embodiment. In detail, FIG. 4 is a block diagram illustrating operations of the clock-sync distributor 153, the node processor 154, and/or the clock-sync combiner 155 illustrated in FIG. 3, but the example embodiments are not limited thereto. For the sake of clarity and convenient description, discussion of some like components from FIG. 3 may be omitted from the discussion of FIG. 4.

Hereinafter, for the sake of clarity and convenient description, the node processor 154 includes a plurality of processing units, such as first to fourth variable node processing units VNU0 to VNU3, and/or a plurality of check node processing units, such as first to fourth check node processing units CNU0 to CNU3, etc., but the example embodiments of the inventive concepts are not limited thereto. Hereinafter, for the sake of clarity and convenient description, the plurality of variable node processing units, e.g., first to fourth variable node processing units VNU0 to VNU3, etc., are connected respectively to the plurality of check node processing units, e.g., first to fourth check node processing units CNU0 to CNU3, etc., but the example embodiments of the inventive concepts are not limited thereto. Hereinafter, for the sake of clarity and convenient description, all the first to fourth variable node processing units VNU0 to VNU3 operate based on the same clock signal, and all the first to fourth check node processing units CNU0 to CNU3 operate based on the same clock signal, but the example embodiments of the inventive concepts are not limited thereto. Hereinafter, for the sake of clarity and convenient description, the first to fourth variable node processing units VNU0 to VNU3 operate based on the first clock signal CLK1, and the first to fourth check node processing units CNU0 to CNU3 operate based on the second clock signal CLK2, but the example embodiments of the inventive concepts are not limited thereto. Hereinafter, description is made with reference to FIG. 3, but the example embodiments are not limited thereto.

Referring to FIG. 4, the multi-clock device 152 may provide the first and second clock signals CLK1 and CLK2 to the clock-sync distributor 153, but is not limited thereto. The clock-sync distributor 153 may output data based on at least one of the first clock signal CLK1 and the second clock signal CLK2, after receiving the data DIN or CIN based on the first clock signal CLK1, but the example embodiments are not limited thereto.

The clock-sync distributor 153 may output data based on the first clock signal CLK1 as it is, after receiving the data DIN or CIN based on the first clock signal CLK1, but is not limited thereto. The clock-sync distributor 153 may provide data based on the first clock signal CLK1 to each of the first to fourth variable node processing units VNU0 to VNU3, but the example embodiments are not limited thereto.

The clock-sync distributor 153 may output data based on the second clock signal CLK2, after receiving the data DIN or CIN based on the first clock signal CLK1, etc. The clock-sync distributor 153 may provide data based on the second clock signal CLK2, to each of the first to fourth check node processing units CNU0 to CNU3, but is not limited thereto.

The multi-clock device 152 may provide the first clock signal CLK1 to each of the first to fourth variable node processing units VNU0 to VNU3, etc. Accordingly, each of the first to fourth variable node processing units VNU0 to VNU3 may operate based on the first clock signal CLK1. The first to fourth variable node processing units VNU0 to VNU3 may calculate the V2C message based on the first clock signal CLK1. The calculated V2C message may be transmitted to each of the first to fourth check node processing units CNU0 to CNU3 connected respectively to the first to fourth variable node processing units VNU0 to VNU3, and/or the calculated V2C message may be transmitted to the clock-sync combiner 155, etc.

The multi-clock device 152 may provide the second clock signal CLK2 to each of the first to fourth check node processing units CNU0 to CNU3, but is not limited thereto. Accordingly, each of the first to fourth check node processing units CNU0 to CNU3 may operate based on the second clock signal CLK2, etc. The first to fourth check node processing units CNU0 to CNU3 may calculate the C2V message based on the second clock signal CLK2. The calculated C2V message may be transmitted to each of the first to fourth variable node processing units VNU0 to VNU3 connected respectively to the first to fourth check node processing units CNU0 to CNU3, and/or the calculated C2V message may be transmitted to the clock-sync combiner 155, but the example embodiments are not limited thereto.

The multi-clock device 152 may provide the first and second clock signals CLK1 and CLK2 to the clock-sync combiner 155, but is not limited thereto. The clock-sync combiner 155 may receive a plurality of pieces of data received from the first to fourth variable node processing units VNU0 to VNU3 and/or the first to fourth check node processing units CNU0 to CNU3, etc.

The clock-sync combiner 155 may receive data based on the first clock signal CLK1, and/or output data based on the first clock signal CLK1, but is not limited thereto. The clock-sync combiner 155 may receive data based on the second clock signal CLK2 and/or output data based on the first clock signal CLK1, but is not limited thereto. That is, the clock-sync combiner 155 may receive data based on at least one of the first clock signal CLK1 and the second clock signal CLK2, and may output the codeword COUT based on the first clock signal CLK1, but the example embodiments are not limited thereto.

In at least one example embodiment according to the inventive concepts, the error correction decoder 150D includes the clock-sync distributor 153 and the clock-sync combiner 155 between the decoder memory 151 operating based on the first clock signal CLK1, and the node processor 154 operating based on the second clock signal CLK2, and thus, the error correction circuit 150 with a high operating speed and low power consumption may be provided, but the example embodiments are not limited thereto.

Figure 5:
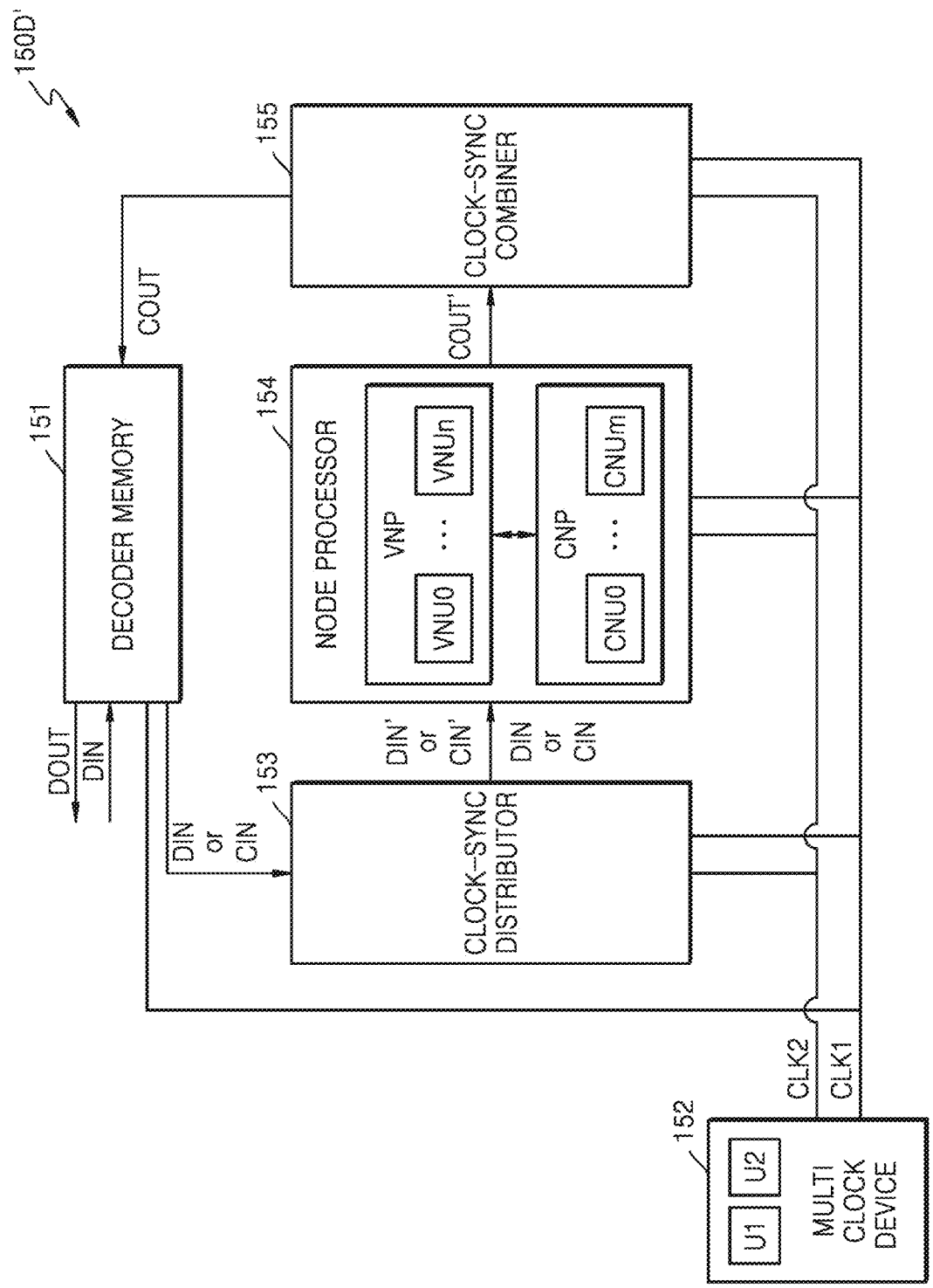
FIG. 5 is a block diagram illustrating an error correction decoder according to at least one example embodiment.

FIG. 5 is a block diagram illustrating an error correction decoder according to at least one example embodiment. In detail, FIG. 5 is another example embodiment of the error correction decoder 150D described with reference to FIG. 2, but the example embodiments are not limited thereto. Hereinafter, description is made with reference to FIGS. 2 to 4, and the same reference numerals refer to the same components, and thus, redundant descriptions thereof are omitted.

Referring to FIG. 5, an error correction decoder 150D' may include a decoder memory 151, a multi-clock device 152, a clock-sync distributor 153, a node processor 154, and/or a clock-sync combiner 155, etc., but the example embodiments are not limited thereto, and for example, the error correction decoder 150D' may include a greater or lesser number of constituent components, etc.

The multi-clock device 152 may generate a plurality of clock signals, such as a first clock signal CLK1 used in the error correction decoder 150D', and/or a second clock signal CLK2 having a higher frequency than a frequency of the first clock signal CLK1, etc., but the example embodiments are not limited thereto. The first and second clock signals CLK1 and CLK2 are an example, and the example embodiments of the inventive concepts are not limited thereto, and the multi-clock device 152 may generate three or more clock signals, etc.

The multi-clock device 152 may include a data collection unit U1 (e.g., a data collection device, data collection circuitry, etc.) and/or a frequency control unit U2 (e.g., a frequency controller, a frequency controller device, frequency control circuitry, etc.), but is not limited thereto.

The data collection unit U1 may temporarily store sub-data transmitted from the node processor 154. The sub-data may indicate internal information generated when error correction decoding is repeatedly performed, etc. For example, the sub-data may include a V2C message, a C2V message, a syndrome, and/or a checksum, etc. The data collection unit U1 may transmit the sub-data to the frequency control unit U2. In at least one other example embodiment, the data collection unit U1 may receive sub-data from the decoder memory 151 and/or the clock-sync combiner 155, etc., but is not limited thereto.

The frequency control unit U2 may determine the reliability of an arithmetic operation result of the node processor 154 based on the sub-data received from the data collection unit U1, etc. For example, the frequency control unit U2 may determine reliability of the arithmetic operation result by using a syndrome among the sub-data received from the data collection unit U1, etc. When the syndrome is used, the frequency control unit U2 may check the number of 0s or 1s in a syndrome vector, and the frequency control unit U2 may determine that the reliability of an arithmetic operation result is higher as the number of 0s included in the syndrome vector becomes higher, etc., but the example embodiments are not limited thereto.

The frequency control unit U2 may control a frequency of a clock signal provided to the clock-sync distributor 153, the node processor 154, and/or the clock-sync combiner 155, etc., based on the sub-data received from the data collection unit U1, but the example embodiments are not limited thereto. When the frequency control unit U2 determines that the reliability of the arithmetic operation result of the node processor 154 is high (e.g., higher than a desired reliability threshold, etc.), the frequency of the clock signal provided to the clock-sync distributor 153, the node processor 154, and/or the clock-sync combiner 155 may be controlled to be low (e.g., lower than a current clock frequency, lower than a default clock frequency, etc.).

For example, when the frequency control unit U2 determines that the reliability of the arithmetic operation result of the node processor 154 is high, the frequency control unit U2 may control the frequency of the second clock signal CLK2 to be the same as the frequency of the first clock signal CLK1, but is not limited thereto. In this case, the clock-sync distributor 153 may provide the data based on the first clock signal CLK1 among the data received from the decoder memory 151 to the node processor 154 as it is (e.g., at the same clock frequency that the data was received, etc.). Accordingly, the node processor 154 may perform an arithmetic operation based on the first clock signal CLK1, and the clock-sync combiner 155 receiving output data of the node processor 154 may also output an output data of the node processor 154 based on the first clock signal CLK1, etc.

In contrast to this, when the frequency control unit U2 determines that the reliability of the arithmetic operation result of the node processor 154 is low (e.g., below a desired reliability threshold), the multi-clock device 152 may control the frequency of the clock signal provided to the clock-sync distributor 153, the node processor 154, and/or the clock-sync combiner 155 to be increased (e.g., greater than a current clock frequency and/or a default clock frequency, etc.). For example, the multi-clock device 152 may control the frequency of the first clock signal CLK1 to be the same as the frequency of the second clock signal CLK2, but the example embodiments are not limited thereto.

As such, the frequency control unit U2 controls and/or sets the frequencies of clock signals according to the reliability of an arithmetic operation result of the node processor 154, and thus, power consumption (and/or unnecessary power consumption) for error correction decoding may be reduced.

Figure 6:
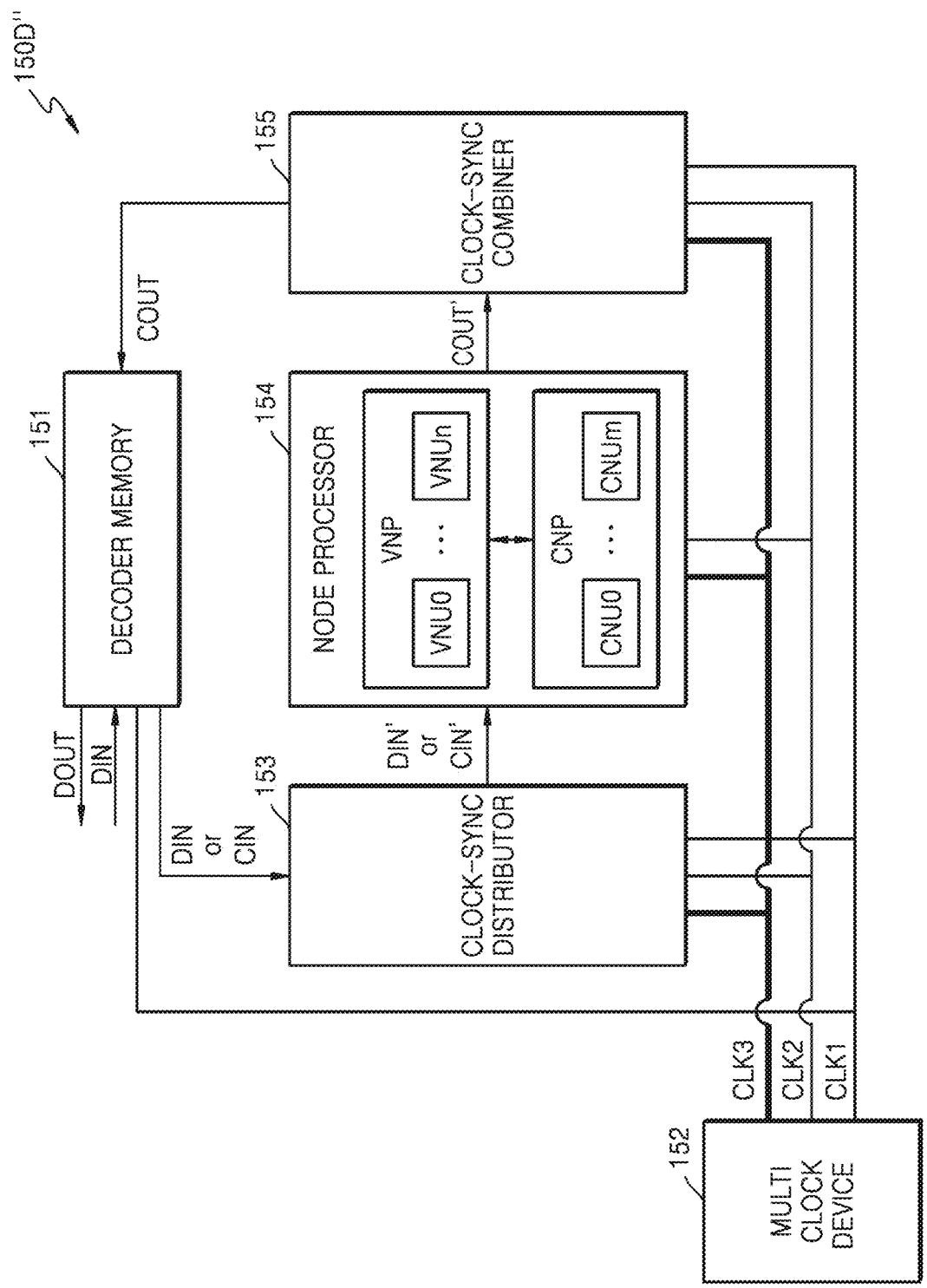
FIG. 6 is a block diagram illustrating an error correction decoder according to at least one example embodiment.
Figure 7:
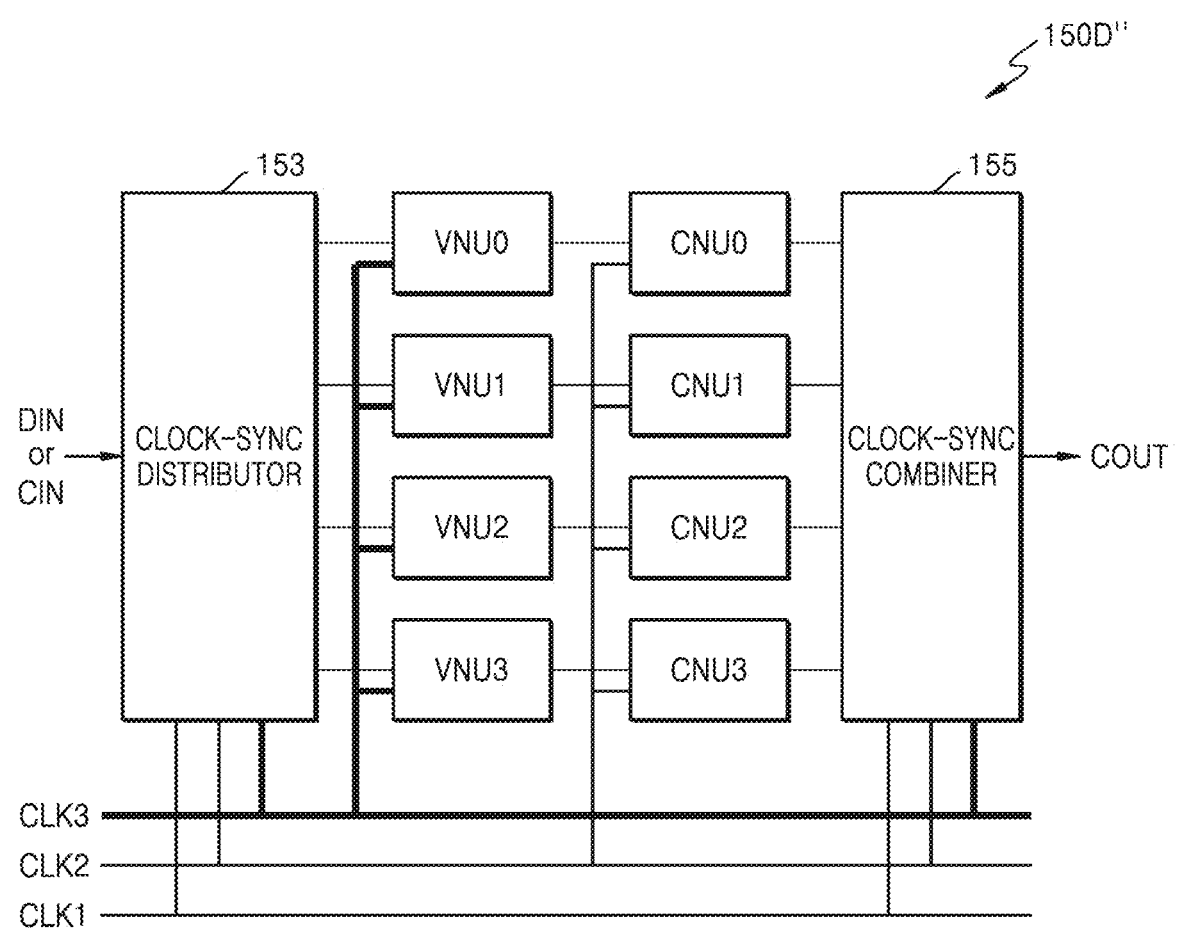
FIG. 7 is a diagram illustrating an operation of an error correction decoder according to at least one example embodiment.

FIGS. 6 and 7 are block diagrams illustrating error correction decoders according to some example embodiments. In detail, FIGS. 6 and 7 illustrate other example embodiments of FIG. 3, and are diagrams illustrating an error correction decoder 150D" included in the error correction circuit 150 of FIG. 2, but the example embodiments are not limited thereto. Hereinafter, description is made with reference to FIGS. 2 and 3, and redundant descriptions thereof are omitted.

Referring to FIG. 6, the error correction decoder 150D" includes a decoder memory 151, a multi-clock device 152, a clock-sync distributor 153, a node processor 154, and/or a clock-sync combiner 155, etc., but the example embodiments are not limited thereto.

The multi-clock device 152 may provide a plurality of clock signals, e.g., first to third clock signals CLK1 to CLK3, etc., used in the error correction decoder 150D", but the example embodiments are not limited thereto. The multi-clock device 152 may provide the clock-sync distributor 153 and the clock-sync combiner 155 with the first clock signal CLK1, the second clock signal CLK2 having a frequency higher than a frequency of the first clock signal CLK1, and the third clock signal CLK3 having a higher frequency than the frequency of the second clock signal CLK2, etc. The multi-clock device 152 may control and/or generate the frequencies of the first to third clock signals CLK1 to CLK3, etc.

The multi-clock device 152 may provide the first clock signal CLK1 to the decoder memory 151, the clock-sync distributor 153, and/or the clock-sync combiner 155, etc. The multi-clock device 152 may provide the second clock signal CLK2 and/or the third clock signal CLK3 to the clock-sync distributor 153, the node processor 154, and/or the clock-sync combiner 155, etc. Accordingly, the decoder memory 151 may operate based on the first clock signal CLK1, the clock-sync distributor 153 and the clock-sync combiner 155 may operate based on the first to third clock signals CLK1 to CLK3, and/or the node processor 154 may operate based on the second clock signal CLK2 and the third clock signal CLK3, but the example embodiments are not limited thereto.

The clock-sync distributor 153 may receive the first to third clock signals CLK1 to CLK3 from the multi-clock device 152, but is not limited thereto. The clock-sync distributor 153 may receive read data DIN and/or a codeword CIN from the decoder memory 151, etc. The read data DIN and/or the codeword CIN received by the clock-sync distributor 153 from the decoder memory 151 may be referred to as "distributor reception data DIN and/or CIN".

The clock-sync distributor 153 may output the distributor reception data DIN and/or CIN based on a clock signal having a different frequency from a clock signal used to receive the distributor reception data DIN and/or CIN, but the example embodiments are not limited thereto. Read data DIN' and/or a codeword CIN' output from the clock-sync distributor 153 based on a clock signal having a different frequency from the clock signal used to receive the distributor reception data DIN and/or CIN may be referred to as "distributor output data DIN' or CIN'".

A frequency of the clock signal based on the distributor output data DIN' and/or CIN' may be higher than the frequency of the clock signal based on the distributor reception data DIN and/or CIN, but the example embodiments are not limited thereto. For example, the distributor reception data DIN and/or CIN may be based on the first clock signal CLK1, and the distributor output data DIN' and/or CIN' may be based on the second clock signal CLK2 and/or the third clock signal CLK3, etc., but the example embodiments are not limited thereto.

The clock-sync distributor 153 may provide the distributor output data DIN' and/or CIN' in parallel to the node processor 154, but is not limited thereto, and for example, may provide the distributor output data DIN' and/or CIN' serially to the node processor 154, etc.

For example, the clock-sync distributor 153 may receive the read data DIN based on the first clock signal CLK1 from the decoder memory 151 in a first iteration, and then, may output the read data DIN' based on at least one of the second clock signal CLK2 and the third clock signal CLK3, etc. That is, the clock-sync distributor 153 may generate read data based on the second clock signal CLK2, may generate read data based on the third clock signal CLK3, and may provide the read data based on the second clock signal CLK2 and the read data based on the third clock signal CLK3 in parallel to the node processor 154, but the example embodiments are not limited thereto.

For example, the clock-sync distributor 153 may receive the codeword CIN based on the first clock signal CLK1 from the decoder memory 151 in an iteration (e.g., a subsequent iteration, and/or a current iteration, etc.) after the first iteration, and/or may output codewords CIN' based on at least one of the second clock signal CLK2 and the third clock signal CLK3, but is not limited thereto. That is, the clock-sync distributor 153 may generate a codeword based on the second clock signal CLK2 and/or a codeword based on the third clock signal CLK3, and may provide the codeword based on the second clock signal CLK2 and/or the codeword based on the third clock signal CLK3 in parallel to the node processor 154, etc.

The node processor 154 may receive data output from the clock-sync distributor 153 in parallel, but the example embodiments are not limited thereto, and for example, the node processor 154 may receive the data serially. The node processor 154 may perform error correction decoding based on the data received from the clock-sync distributor 153, etc. The node processor 154 may provide output data COUT' generated as a result of error correction decoding to the clock-sync combiner 155, etc. The output data COUT' may be based on the second clock signal CLK2 or the third clock signal CLK3, but the example embodiments are not limited thereto.

Each of the variable node processing units VNU0 to VNUn may operate based on the second clock signal CLK2 and/or the third clock signal CLK3 provided from the multi-clock device 152, etc. According to at least one example embodiment, the same clock signal (for example, the third clock signal CLK3) may also be provided to all of the variable node processing units VNU0 to VNUn, and the second clock signal CLK2 may also be provided to some (e.g., a first subset) of the variable node processing units VNU0 to VNUn, and the third clock signal CLK3 may be provided to the others (e.g., a second subset) thereof, but the example embodiments are not limited thereto.

Each of the check node processing units CNU0 to CNUm may operate based on the second clock signal CLK2 and/or the third clock signal CLK3 provided from the multi-clock device 152, etc. According to at least one example embodiment, the same clock signal (for example, the second clock signal CLK2) may also be provided to all of the check node processing units CNU0 to CNUm, and the second clock signal CLK2 may also be provided to some (e.g., a first subset) of the check node processing units CNU0 to CNUm, and the third clock signal CLK3 may also be provided to the others (e.g., a second subset) thereof, but the example embodiments are not limited thereto.

The clock-sync combiner 155 may receive the plurality of clock signals, e.g., clock signals CLK1 to CLK3, etc., from the multi-clock device 152, but is not limited thereto. The clock-sync combiner 155 may receive the output data COUT' of the node processor 154. The output data COUT' may be based on the second clock signal CLK2 or the third clock signal CLK3, but is not limited thereto.

The clock-sync combiner 155 may receive the output data COUT' of the node processor 154, and may output the output data COUT' based on the first clock signal CLK1, etc. Output data of the clock-sync combiner 155 may be referred to as a "codeword". The clock-sync combiner 155 may transmit the codeword COUT based on the first clock signal CLK1 to the decoder memory 151, but the example embodiments are not limited thereto.

Referring to FIG. 7, the multi-clock device 152 may provide the plurality of clock signals, e.g., first to third clock signals CLK1 to CLK3, etc., to the clock-sync distributor 153, but the example embodiments are not limited thereto.

The clock-sync distributor 153 may receive the data DIN and/or CIN based on the first clock signal CLK1, and then convert the received data into data (e.g., synchronized data, etc.) based on the third clock signal CLK3. The clock-sync distributor 153 may provide the synchronized data based on the third clock signal CLK3 to each of the first to fourth variable node processing units VNU0 to VNU3, but the example embodiments are not limited thereto.

The clock-sync distributor 153 may receive the data DIN and/or CIN based on the first clock signal CLK1, and then convert the received data into data (e.g., synchronized data, etc.) based on the second clock signal CLK2. The clock-sync distributor 153 may provide the synchronized data based on the second clock signal CLK2 to each of the first to fourth check node processing units CNU0 to CNU3, but the example embodiments are not limited thereto.

The multi-clock device 152 may provide the third clock signal CLK3 to each of the first to fourth variable node processing units VNU0 to VNU3, etc. Accordingly, each of the first to fourth variable node processing units VNU0 to VNU3 may operate based on the third clock signal CLK3, but are not limited thereto. The first to fourth variable node processing units VNU0 to VNU3 may calculate the V2C message based on the third clock signal CLK3, but are not limited thereto. The calculated V2C message may be transmitted to each of the first to fourth check node processing units CNU0 to CNU3 connected respectively to the first to fourth variable node processing units VNU0 to VNU3, and/or may be transmitted to the clock-sync combiner 155, etc.

The multi-clock device 152 may provide the second clock signal CLK2 to each of the first to fourth check node processing units CNU0 to CNU3, etc. Accordingly, each of the first to fourth check node processing units CNU0 to CNU3 may operate based on the second clock signal CLK2, but are not limited thereto. The first to fourth check node processing units CNU0 to CNU3 may calculate the C2V message based on the second clock signal CLK2, but are not limited thereto. The calculated C2V message may be transmitted to each of the first to fourth variable node processing units VNU0 to VNU3 connected respectively to the first to fourth check node processing units CNU0 to CNU3 and/or may be transmitted to the clock-sync combiner 155, but the example embodiments are not limited thereto.

The multi-clock device 152 may provide the first to third clock signals CLK1 to CLK3 to the clock-sync combiner 155, etc. The clock-sync combiner 155 may receive data based on the third clock signal CLK3 and data based on the second clock signal CLK2, and may output data based on the first clock signal CLK1, but the example embodiments are not limited thereto. The clock-sync combiner 155 may output the codeword COUT based on the first clock signal CLK1, but is not limited thereto.

In at least one example embodiment of the inventive concepts, the error correction decoder 150D" includes the clock-sync distributor 153 and the clock-sync combiner 155 between the decoder memory 151 operating based on the first clock signal CLK1 and the node processor 154 operating based on the second clock signal CLK2 and the third clock signal CLK3, and thus, power consumption is reduced and high-speed operation is performed.

Figure 8:
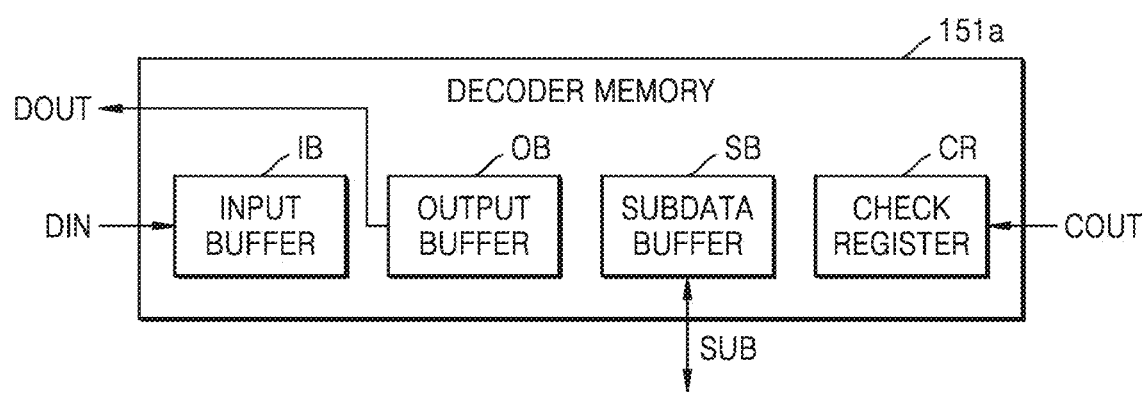
FIG. 8 is a block diagram illustrating a decoder memory according to at least one example embodiment.
Figure 9:
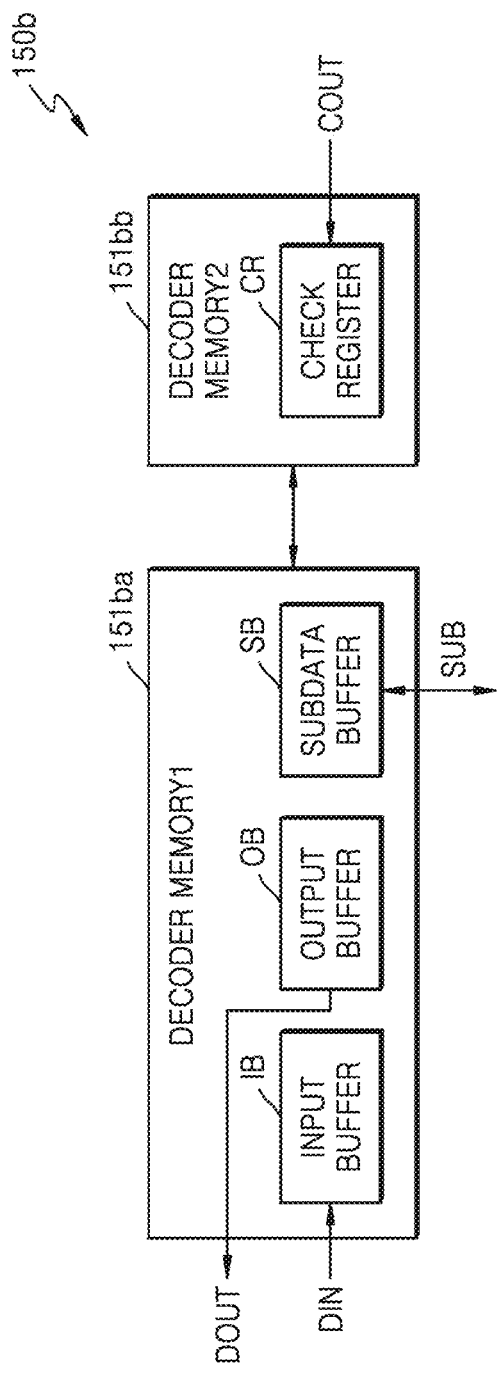
FIG. 9 is a block diagram illustrating a decoder memory according to at least one example embodiment.

FIGS. 8 and 9 are block diagrams illustrating a decoder memory according to at least one example embodiment. In detail, FIGS. 8 and 9 are diagrams to help understanding of FIG. 3 as example embodiments of the decoder memory 151 of FIG. 3, but the example embodiments are not limited thereto. Hereinafter, description is made with reference to FIG. 3.

Referring to FIG. 8, a decoder memory 151*a* may include a plurality of buffer memories and/or a plurality of registers, etc., but is not limited thereto. For example, the decoder memory 151*a* may include an input buffer IB, an output buffer OB, a sub-data buffer SB, and/or a check register CR, etc.

The input buffer IB may store read data DIN input to the error correction decoder 150D, the output buffer OB may store a decoded codeword DOUT output from the error correction decoder 150D, the sub-data buffer SB may store sub-data generated when the error correction decoder 150D performs an error correction operation, and/or the check register CR may store codewords output from the clock-sync combiner 155, etc., but the example embodiments are not limited thereto. The input buffer IB, the output buffer OB, the sub-data buffer SB, and/or the check register CR may exchange data with each other, etc., but are not limited thereto.

Referring to FIG. 9, a decoder memory 151*b* may include at least a first decoder memory 151*ba* and/or a second decoder memory 151*bb*, etc., but is not limited thereto. The first decoder memory 151*ba* may include a plurality of buffer memories, and/or the second decoder memory 151*bb* may include at least one register, etc., but the example embodiments are not limited thereto. The first decoder memory 151*ba* may include an input buffer IB, an output buffer OB, and/or a sub-data buffer SB, etc., and the second decoder memory 151*bb* may include a check register CR, etc. The first decoder memory 151*ba* may exchange data with the second decoder memory 151*bb*, but is not limited thereto.

Figure 10:
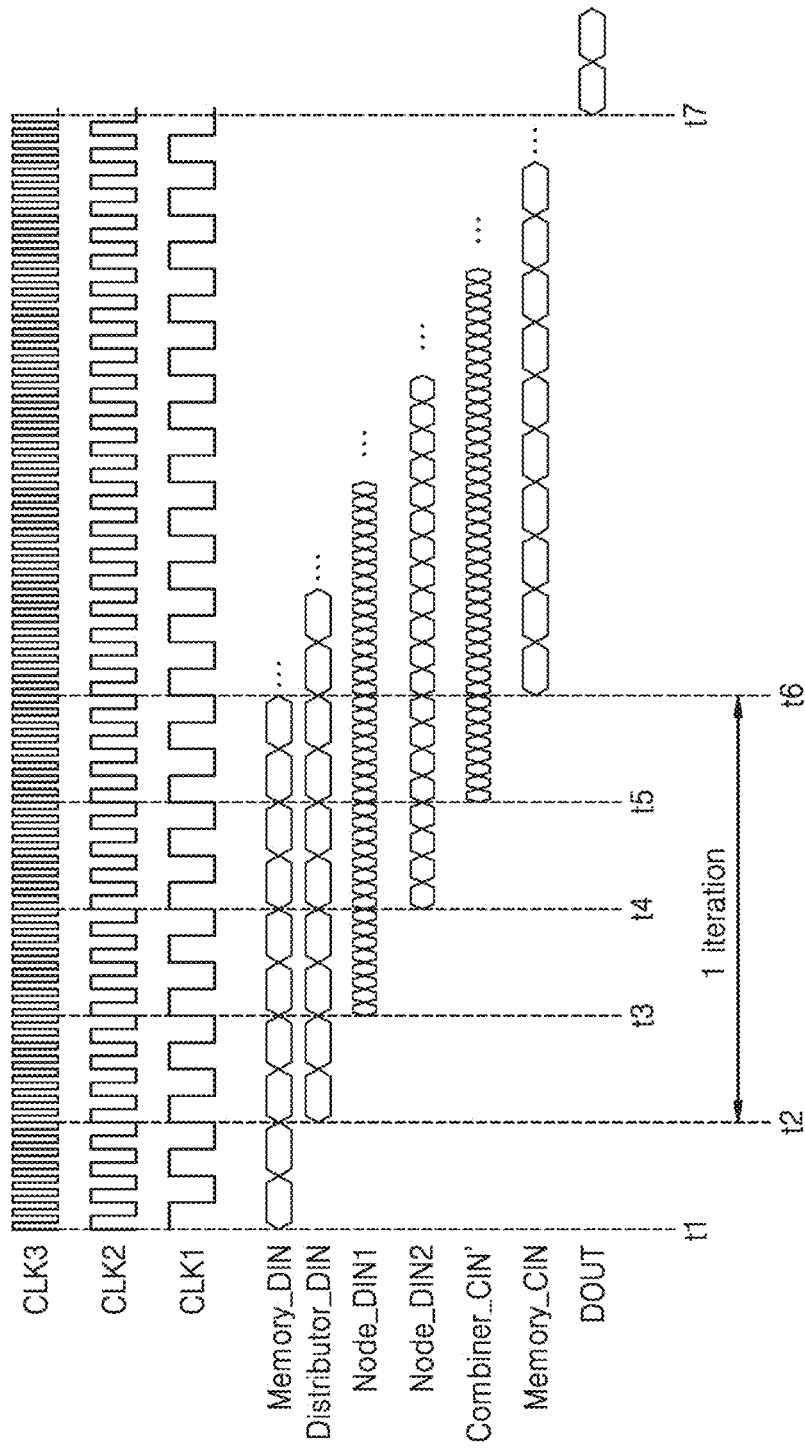
FIG. 10 is a timing diagram illustrating the operation of the error correction decoder according to at least one example embodiment.

FIG. 10 is a timing diagram illustrating an operation of an error correction decoder according to at least one example embodiment. In detail, FIG. 10 is a diagram illustrating an operation of the error correction decoder 150D" of FIGS. 6 and 7, but the example embodiments are not limited thereto. Hereinafter, description is made with reference to FIGS. 6 and 7.

Referring to FIG. 10, the multi-clock device 152 may provide a first clock signal CLK1, a second clock signal CLK2, and/or a third clock signal CLK3, etc. A frequency of the first clock signal CLK1 may be lower than a frequency of the second clock signal CLK2, and the frequency of the second clock signal CLK2 may be lower than a frequency of the third clock signal CLK3, but the example embodiments are not limited thereto. That is, the node processor 154 may perform the highest operation (e.g., may operate the fastest, etc.) when operating based on the third clock signal CLK3, and may perform the lowest operation (e.g., may operate the slowest, etc.) when operating based on the first clock signal CLK1.

At a first point in time t1, read data Memory_DIN may be input to the decoder memory 151 included in the error correction decoder 150D", etc. The read data Memory_DIN may be based on the first clock signal CLK1, but is not limited thereto.

At a second point in time t2, read data Distributor_DIN output from the decoder memory 151 may be input to the clock-sync distributor 153. The read data Distributor_DIN input to the clock-sync distributor 153 may be based on the first clock signal CLK1, but is not limited thereto. The clock-sync distributor 153 may change a clock signal based on the read data Distributor_DIN, for example, the clock-sync distributor 153 may change the clock signal based on the reliability of the read data, the number of errors in the read data, etc., but the example embodiments are not limited thereto. The clock-sync distributor 153 may receive the read data Distributor_DIN based on the first clock signal CLK1, and may output read data Node_DIN1 using a clock signal having a frequency higher than the frequency of the first clock signal CLK1 based on the read data, etc. Although description made with reference to FIG. 10 is based on read data, a codeword may be input to the clock-sync distributor 153 in an iteration after the first iteration, but the example embodiments are not limited thereto.

At a third point in time t3, the clock-sync distributor 153 may output first distributor output data Node_DIN1 using a clock signal having a higher frequency than the frequency of the first clock signal CLK1 based on the read data Distributor_DIN which was read using the first clock signal CLK1, but the example embodiments are not limited thereto. The first distributor output data Node_DIN1 may be based on the third clock signal CLK3, but is not limited thereto. The first distributor output data Node_DIN1 may be input to the node processor 154, etc. The first distributor output data Node_DIN1 may be input to the variable node processing units VNU0 to VNUn, etc.

At a fourth point in time t4, the clock-sync distributor 153 may output second distributor output data Node_DIN2 using a clock signal having a higher frequency than the frequency of the first clock signal CLK1 based on the read data Distributor_DIN which was read using the first clock signal CLK1. The second distributor output data Node_DIN2 may be output based on the second clock signal CLK2, but is not limited thereto. The second distributor output data Node_DIN2 may be input to the node processor 154, but is not limited thereto. The second distributor output data Node_DIN2 may be input to the check node processing units CNU0 to CNUm, etc.

Although FIG. 10 illustrates that the first distributor output data Node_DIN1 based on the third clock signal CLK3 and the second distributor output data Node_DIN2 based on the second clock signal CLK2 are input to the node processor 154 with a time difference, the example embodiments of the inventive concepts are not limited thereto. For example, the first and second distributor output data Node_DIN1 and Node_DIN2 of FIG. 10 may correspond to the converted data DIN' of FIG. 6, but the example embodiments are not limited thereto.

At a fifth point in time t5, output data Combiner_CIN' of the node processor 154 may be input to the clock-sync combiner 155. Although FIG. 10 illustrates a case in which the output data Combiner_CIN' based on the third clock signal CLK3 is input to the clock-sync combiner 155 for the sake of clarity and convenient description, the example embodiments of the inventive concepts are not limited thereto, and output data Combiner_CIN' based on the second clock signal CLK2 may also be input to the clock-sync combiner 155, etc. The clock-sync combiner 155 may receive the output data Combiner_CIN' and generate a codeword Memory_CIN based on the first clock signal CLK1, but is not limited thereto.

At a sixth point in time t6, the codeword Memory_CIN output based on the first clock signal CLK1 from the clock-sync combiner 155, may be input to the decoder memory 151. That is, all data input to and output from the decoder memory 151 may be based on the first clock signal CLK1, but the example embodiments are not limited thereto.

A period from the second point in time t2 to the sixth point in time t6 may be defined as one iteration, but the example embodiments are not limited thereto. That is, one repetition may be performed until data output from the clock-sync combiner 155 is input to the decoder memory 151 after data is input to the clock-sync distributor 153.

At a seventh point in time t7, a decoded codeword DOUT may be output from the decoder memory 151. The decoded codeword DOUT may indicate a highly reliable codeword among the codewords Memory_CIN output from the clock-sync combiner 155. Accordingly, the decoded codeword DOUT may be based on the first clock signal CLK1 based on the high reliability of the decoded codeword DOUT, etc.

Figure 12:
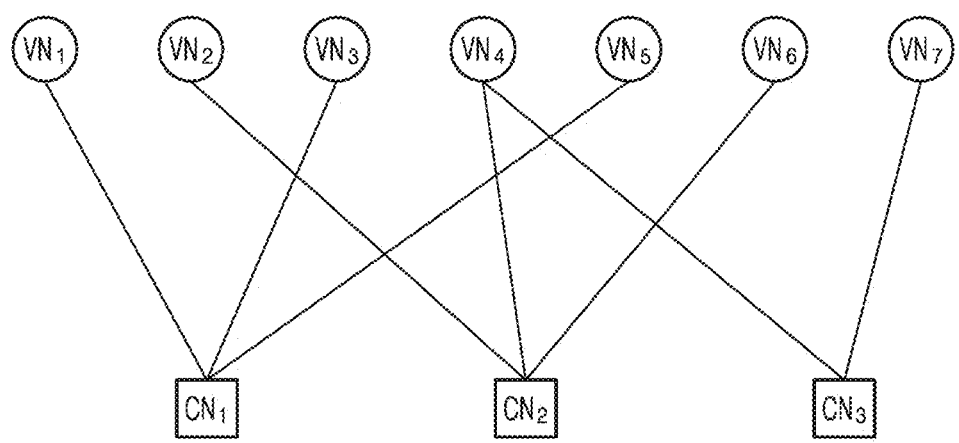
FIG. 12 is a diagram illustrating an operation of a node processor according to at least one example embodiment.

FIGS. 11 to 12 are diagrams illustrating an operation of a node processor according to at least one example embodiment. In detail, FIGS. 11 and 12 are diagrams illustrating an operation of the node processor 154 of FIG. 3, but the example embodiments are not limited thereto. FIG. 11 is an example diagram illustrating a parity check matrix, and FIG. 12 is a diagram illustrating the parity check matrix as a Tanner graph. Hereinafter, description is made with reference to FIG. 3, but the example embodiments are not limited thereto.

Referring to FIG. 11, the error correction encoder 150E and the error correction decoder 150D included in the error correction circuit 150 may perform an error correction operation by using the same parity check matrix, etc. The parity check matrix may define an (N, K) code as a parity check matrix having a size of M×N, but the example embodiments are not limited thereto. Here, K represents a length of original data, M represents the number of parities, and N may indicate M+K. N and K may be natural numbers. For example, FIG. 11 illustrates a parity check matrix H defining a (7, 4) code, but the example embodiments are not limited thereto.

Each entry of the parity check matrix may be "0" or "1" (e.g., a binary value, etc.). When the number of Is included in the parity check matrix is relatively small compared to the number of 0s, the (N, K) code may be referred to as an (N, K) LDPC code.

A matrix in which each entry is composed of a sub-matrix may be referred to as a "base matrix" and/or a "basic matrix". Each entry of the basic matrix may include a sub-matrix having a size of z×z, but is not limited thereto. Here, z may be an integer greater than or equal to 2. For example, in the basic matrix of a binary LDPC code, "0" may indicate that a corresponding entry is a zero matrix, and "1" may indicate that a corresponding entry Is not the zero matrix.

For example, "1" in the basic matrix of a quasi cyclic (QC)-LDPC code may indicate that a corresponding entry is a cyclic permutation matrix. The cyclic permutation matrix may be obtained by cyclic-shifting an identity matrix by a desired and/or preset shift value, and any one cyclic permutation matrix may have a different shift value from another cyclic permutation matrix.

Referring to FIG. 12, the Tanner graph may be represented by N-K check nodes, N variable nodes, and/or edges, etc. The check nodes may correspond to rows of the parity check matrix, and the variable nodes may correspond to columns of the parity check matrix, but the example embodiments are not limited thereto. Each of the edges may connect one check node to one variable node and may represent an entry represented by "1" in the parity check matrix, etc.

The parity check matrix of the (7, 4) code illustrated in FIG. 11 may be represented by a Tanner graph including a plurality of check nodes, e.g., three check nodes CN1 to CN3, and a plurality of variable nodes, e.g., seven variable nodes VN1 to VN7 as illustrated in FIG. 12, but the example embodiments are not limited thereto. Solid lines connecting the check nodes CN1 to CN3 to the variable nodes VN1 to VN7 may represent the edges. Repeated error correction decoding may be performed by repeatedly exchanging messages between the check nodes CN1 to CN3 and the variable nodes VN1 to VN7, etc.

Figure 13:
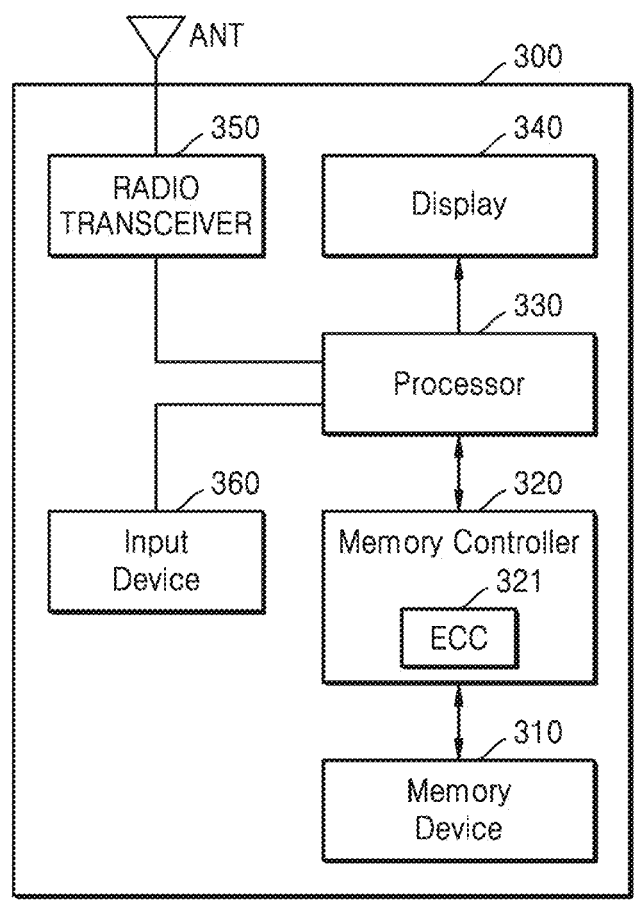
FIG. 13 is a diagram illustrating a memory system according to at least one example embodiment.

FIG. 13 is a diagram illustrating a memory system according to at least one example embodiment. In detail, FIG. 13 is a diagram illustrating at least one other example embodiment of a memory system including the memory controller 140 illustrated in FIG. 2, however the example embodiments are not limited thereto. Hereinafter, description is made with reference to FIGS. 2 to 7.

Referring to FIG. 13, a memory system 300 may be implemented by, for example, a cellular phone, a smartphone, a tablet, a personal computer (PC), a personal digital assistant (PDA), and/or a wireless communication device, etc., but the example embodiments are not limited thereto. The memory system 300 may include a memory device 310 and/or a memory controller 320 capable of controlling an operation of the memory device 310, etc. The memory device 310 may correspond to the memory device 130 of FIG. 2, but is not limited thereto.

The memory controller 320 may control a data access operation, such as a program (e.g., write) operation, an erase operation, and/or a read operation, etc., of the memory device 310 under the control by at least one processor 330, etc. The memory controller 320 may correspond to the controller 140 of FIG. 2, but is not limited thereto. The memory controller 320 may include an error correction circuit 321, but is not limited thereto. The error correction circuit 321 may include the multi-clock device 152, the clock-sync distributor 153, and/or the clock-sync combiner 155, for example, as discussed in connection with FIGS. 3 to 7, but the example embodiments are not limited thereto. Accordingly, it is possible to provide the memory system 300 that may reduce power consumption (and/or unnecessary power consumption) and/or perform high-speed operation, etc. According to at least one example embodiment, the controller 320 may also be implemented as a part of the processor 330 and/or as a separate chip from the processor 330, but the example embodiments are not limited thereto.

The processor 330 may process a signal output from a radio transceiver 350 and/or transmit the processed signal to the memory controller 320 and/or a display 340, etc. The processor 330 may control an operation of the display 340 such that data output from the memory controller 320, data output from the radio transceiver 350, and/or data output from the input device 360 may be output through the display 340, etc. The processor 330 may correspond to the host 110 of FIG. 2, but is not limited thereto.

The display 340 may output data output from the memory controller 320, the data output from the radio transceiver 350, and/or the data output from the input device 360 under the control by the memory controller 320, but is not limited thereto.

The radio transceiver 350 may transmit and/or receive wireless signals through an antenna ANT. For example, the radio transceiver 350 may change a wireless signal received through the antenna ANT into a signal that may be processed by the processor 330, etc. In addition, the radio transceiver 350 may change a signal output from the processor 330 into a wireless signal and/or output the changed wireless signal to an external device through the antenna ANT, etc.

The input device 360 may receive a control signal for controlling an operation of the processor 330 and/or data to be processed by the processor 330, etc. For example, the input device 360 may be implemented by a pointing device, such as a touch pad and/or a computer mouse, etc., a keypad, a microphone, a camera, and/or a keyboard, etc.

Figure 14:
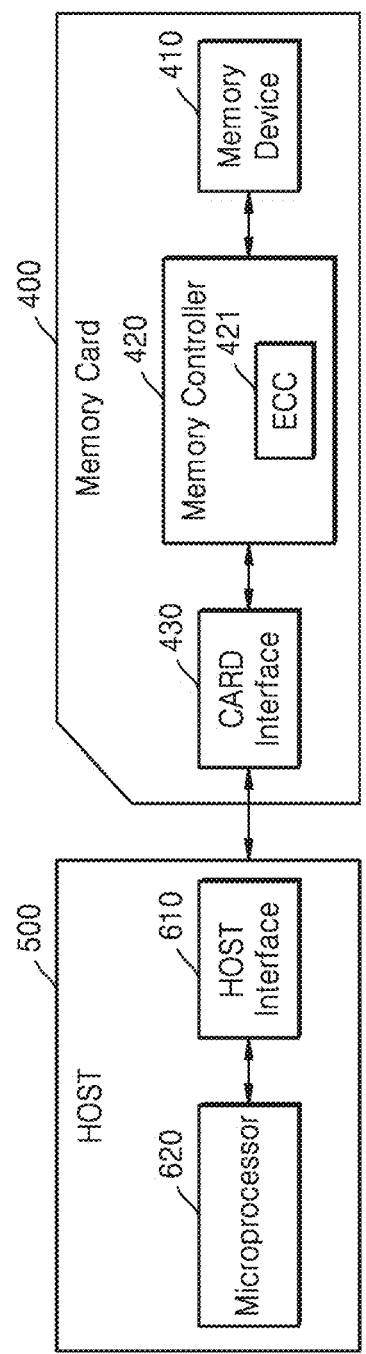
FIG. 14 is a block diagram illustrating a memory system according to at least one example embodiment.

FIG. 14 is a diagram illustrating a memory system according to at least one example embodiment. In detail, FIG. 14 is a diagram illustrating at least one other example embodiment of a memory system including the memory controller 140 illustrated in FIG. 2, however, the example embodiments are not limited thereto. Hereinafter, description is made with reference to FIGS. 2 to 7.

Referring to FIG. 14, a memory system 400 may be implemented by a memory card and/or a smart card, etc., but is not limited thereto. The memory system 400 may include a memory device 410, a memory controller 420, and/or a card interface 430, etc.

The memory controller 420 may control data exchange between the memory device 410 and the card interface 430, etc. The memory device 410 may correspond to the memory device 130 of FIG. 2, and the memory controller 420 may correspond to the controller 140 of FIG. 2, but the example embodiments are not limited thereto. The memory controller 420 may include an error correction circuit 421, etc. The error correction circuit 421 may include the multi-clock device 152, the clock-sync distributor 153, and/or the clock-sync combiner 155, etc., as discussed in connection with FIGS. 3 to 7, but the example embodiments are not limited thereto. Accordingly, it is possible to provide the memory system 400 that may reduce power consumption (e.g., reduce unnecessary power consumption, etc.) and/or perform high-speed operation, etc.

The card interface 430 may interface data exchange between a host 500 and the memory controller 420 according to a protocol of the host 500, but is not limited thereto. According to at least one example embodiment, the card interface 430 may support a Universal Serial Bus (USB) protocol and an InterChip (IC)-USB protocol, but is not limited thereto. The card interface 430 may indicate hardware capable of supporting a protocol used by the host 500, software installed in the hardware, and/or a signal transmission method. The card interface 430 may include a secure digital (SD) card interface and/or a multi-media card (MMC) interface, but is not limited thereto.

When the memory system 400 is connected to the host interface 610 of the host 500, such as a PC, a tablet, a digital camera, a digital audio player, a cellular phone, console video game hardware, and/or a digital set-top box, etc., the host interface 610 may perform data communication with the memory device 410 through the card interface 430 and the memory controller 420 under the control by the microprocessor 620 (e.g., a processor, processing circuitry, etc.), but the example embodiments are not limited thereto.

While various example embodiments of the inventive concepts have been particularly shown and described, it will be understood that various changes in form and details may be made therein without departing from the spirit and scope of the following claims.

What is claimed is:

1. An error correction circuit comprising:
    clock-sync distributor circuitry configured to output a plurality of distributor output data based on distributor reception data received using a first clock signal, each of the plurality of distributor output data output based on the first clock signal or a second clock signal, the second clock signal having a higher frequency than a frequency of the first clock signal;
    a node processor configured to generate a plurality of output data by performing error correction decoding using the plurality of distributor output data, output a first subset of the plurality of output data based on the first clock signal, and output a second subset of the plurality of output data based on the second clock signal; and clock-sync combiner circuitry configured to output, based on the first clock signal, the plurality of output data received from the node processor.

2. The error correction circuit of claim 1, wherein the node processor comprises:
a variable node processor configured to operate based on one of the first clock signal and the second clock signal; and
a check node processor configured to operate based on the clock signal different from the clock signal applied to the variable node processor among the first clock signal and the second clock signal.

3. The error correction circuit of claim 1, further comprising:
a decoder memory configured to operate based on the first clock signal, and store the distributor reception data; and
a multi-clock generating device configured to generate the first clock signal and the second clock signal, and provide the first clock signal and the second clock signal to the clock-sync distributor circuitry, the node processor, and the clock-sync combiner circuitry.

4. The error correction circuit of claim 3, wherein the multi-clock generating device is configured to:
store sub-data generated by the node processor during the error correction decoding; and
control the frequency of the second clock signal based on the sub-data.

5. The error correction circuit of claim 4, wherein the multi-clock generating device is further configured to control the frequency of the second clock signal by:
reducing the frequency of the second clock signal in response to determining a reliability of an arithmetic operation result of the node processor is high based on the sub-data; and
increasing the frequency of the second clock signal in response to determining the reliability of the arithmetic operation result of the node processor is low based on the sub-data.

6. The error correction circuit of claim 3, wherein the decoder memory comprises at least one buffer memory.

7. An error correction circuit comprising:
clock-sync distributor circuitry configured to receive distributor reception data based on a first clock signal, and output a plurality of first distributor output data based on a second clock signal having a higher frequency than a frequency of the first clock signal, and output a plurality of second distributor output data based on a third clock signal having a higher frequency than the frequency of the second clock signal;
a node processor configured to generate a plurality of output data by performing error correction decoding using the plurality of first distributor output data and the plurality of second distributor output data, output a first subset of the plurality of output data based on the second clock signal, and output a second subset of the plurality of output data based on the third clock signal; and
clock-sync combiner circuitry configured to output, based on the first clock signal, the plurality of output data.

8. The error correction circuit of claim 7, wherein the node processor comprises:

a variable node processor configured to operate based on one of the second clock signal and the third clock signal; and
a check node processor configured to operate based on the clock signal different from the clock signal used by the variable node processor among the second clock signal and the third clock signal.

9. The error correction circuit of claim 7, further comprising:
a decoder memory configured to operate based on the first clock signal, and store the distributor reception data; and
a multi-clock generating device configured to generate the first clock signal, the second clock signal, and the third clock signal, and provide at least one of the first clock signal, the second clock signal, and the third clock signal to the decoder memory, the clock-sync distributor circuitry, the node processor, and the clock-sync combiner circuitry.

10. The error correction circuit of claim 9, wherein the multi-clock generating device is further configured to:
store sub-data generated by the node processor; and
control the frequencies of the second clock signal and the third clock signal based on the sub-data.

11. The error correction circuit of claim 10, wherein the multi-clock generating device is further configured to:
reduce the frequency of at least one of the second clock signal and the third clock signal in response to determining a reliability of an arithmetic operation result of the node processor is high; and
increase the frequency of at least one of the second clock signal and the third clock signal in response to determining the reliability of the arithmetic operation result of the node processor is low.

12. The error correction circuit of claim 10, wherein multi-clock generating device is further configured to:
set the frequency of at least one of the second clock signal and the third clock signal to be the same as the frequency of the first clock signal in response to determining a reliability of an arithmetic operation result of the node processor is high.

13. A semiconductor device comprising:
a controller including an error correction circuit, the error correction circuit configured to perform error correction decoding of read data based on a plurality of clock signals having different frequencies; and
a memory device configured to output the read data and provide the read data to the controller.

14. The semiconductor device of claim 13, wherein the error correction circuit comprises:
a decoder memory configured to store the read data;
clock-sync distributor circuitry configured to receive the read data from the decoder memory based on a first clock signal, and output a plurality of distributor output data, each of the plurality of distributor output data output based on one of a second clock signal and a third clock signal, the second clock signal having a different frequency from the first clock signal, and a third clock signal having a different frequency from the first and second clock signals;
a node processor configured to perform error correction decoding using the plurality of distributor output data, and output a plurality of output data based on one of the second clock signal and the third clock signal;
clock-sync combiner circuitry configured to output, based on the first clock signal, the plurality of output data received from the node processor; and a multi-clock generating device configured to generate the first to third clock signals.

15. The semiconductor device of claim 14, wherein the frequency of the first clock signal is lower than the frequencies of the second clock signal and the third clock signal.

16. The semiconductor device of claim 14, wherein the multi-clock generating device is further configured to:
   store sub-data generated by the node processor; and
   control the frequency of at least one of the first to third clock signals based on the sub-data.

17. The semiconductor device of claim 16, wherein the multi-clock generating device is further configured to:
   reduce the frequency of at least one of the first to third clock signals in response to determining a reliability of an arithmetic operation result of the node processor is high; and
   increase the frequency of at least one of the first to third clock signals in response to determining the reliability of the arithmetic operation result of the node processor is low.

18. The semiconductor device of claim 16, wherein the multi-clock generating device is further configured to:
   set the frequency of at least one of the second clock signal and the third clock signal to be the same as the frequency of the first clock signal in response to determining a reliability of an arithmetic operation result of the node processor is high.

19. The semiconductor device of claim 14, wherein the decoder memory comprises:
   a first decoder memory including a plurality of buffer memories; and
   a second decoder memory including at least one register.

20. The semiconductor device of claim 13, wherein the memory device includes a NAND flash memory device.

\* \* \* \* \*